United States Patent
Ogihara et al.

(10) Patent No.: US 8,035,115 B2
(45) Date of Patent: Oct. 11, 2011

(54) SEMICONDUCTOR APPARATUS, PRINT HEAD, AND IMAGE FORMING APPARATUS

(75) Inventors: Mitsuhiko Ogihara, Hachioji (JP); Takahito Suzuki, Hachioji (JP); Hiroshi Kurokawa, Hachioji (JP); Taishi Kaneto, Hachioji (JP)

(73) Assignee: Oki Data Corporation, Tokyo (JP)

( * ) Notice: Subject to any disclaimer, the term of this patent is extended or adjusted under 35 U.S.C. 154(b) by 1202 days.

(21) Appl. No.: 11/382,752

(22) Filed: May 11, 2006

(65) Prior Publication Data

US 2006/0255343 A1 Nov. 16, 2006

(30) Foreign Application Priority Data

May 12, 2005 (JP) ................................. 2005-139655

(51) Int. Cl.
 *H01L 33/00* (2010.01)
(52) U.S. Cl. ................ 257/88; 257/89; 257/90; 257/91; 257/92; 257/93; 257/99; 257/110; 257/120; 257/E25.019; 257/E25.02; 257/E25.021; 257/E25.022; 257/E25.023; 257/E25.024; 257/E25.025; 257/E27.135; 257/E27.138; 257/E21.361
(58) Field of Classification Search .............. 257/88–93, 257/E25.019–E25.021, 99, 110, 120, E27.135, 257/E27.138, E21.361
See application file for complete search history.

(56) References Cited

U.S. PATENT DOCUMENTS

| 4,266,333 | A | * | 5/1981 | Reichert | ........................ | 438/571 |
| 5,482,896 | A | * | 1/1996 | Tang | ............................... | 438/28 |
| 5,707,745 | A | * | 1/1998 | Forrest et al. | .................. | 428/432 |
| 6,365,270 | B2 | * | 4/2002 | Forrest et al. | .................. | 428/336 |
| 6,849,308 | B1 | * | 2/2005 | Speakman et al. | ............ | 427/595 |
| 7,427,782 | B2 | * | 9/2008 | Daniels et al. | .................. | 257/80 |
| 2002/0114596 | A1 | * | 8/2002 | Gaudiana et al. | ............. | 385/120 |
| 2003/0030382 | A1 | * | 2/2003 | Koyama | ..................... | 315/169.1 |
| 2003/0213967 | A1 | * | 11/2003 | Forrest et al. | .................... | 257/96 |
| 2004/0179088 | A1 | * | 9/2004 | Wong et al. | ..................... | 347/238 |
| 2005/0056852 | A1 | * | 3/2005 | Suzuki et al. | .................... | 257/93 |
| 2005/0121662 | A1 | * | 6/2005 | Park | ................................ | 257/13 |
| 2006/0007059 | A1 | * | 1/2006 | Bell | ................................ | 345/55 |

FOREIGN PATENT DOCUMENTS

| JP | 05175547 A | | 7/1993 |
| JP | 06053549 A | * | 2/1994 |
| JP | 11150303 A | | 6/1999 |
| JP | 2000-174344 A1 | | 6/2000 |
| JP | 2003197968 A | | 7/2003 |
| JP | 2004207323 A | | 7/2004 |
| JP | 2005019874 A | | 1/2005 |
| JP | 2005072323 A | | 3/2005 |

OTHER PUBLICATIONS

Merriam Webster OnLine definition of via, serially, and overlap.*
Abstract of Kondo in English.*

* cited by examiner

*Primary Examiner* — Hrayr Sayadian
(74) *Attorney, Agent, or Firm* — Panitch Schwarze Belisario & Nadel LLP

(57) ABSTRACT

A semiconductor apparatus includes a substrate; and a plurality of semiconductor thin films formed on said substrate, each of said semiconductor thin films having a pn-junction, and electrodes of p-type and n-type for injecting carriers to the pn-junction, wherein said semiconductor thin films are formed so that all or a part of said pn-junctions are connected serially. As different from a semiconductor thin film constituted of a single pn-junction, the light emission with the invented semiconductor apparatus is the summation of the light emission intensities of the entire pn-junctions, so that the light emitting intensity can be increased largely.

13 Claims, 27 Drawing Sheets

SEMICONDUCTOR APPARATUS, PRINT HEAD, AND IMAGE FORMING APPARATUS

BACKGROUND OF THE INVENTION

1. Field of the Invention

This invention relates to a semiconductor apparatus such as an LED (light emitting diode) print head used for, e.g., an electrophotographic printer, to a print head having the semiconductor apparatus, and further to an image forming apparatus having such a print head.

2. Description of Related Art

Some light emitting devices have been known as conventional semiconductor apparatuses having an semiconductor epitaxial layer and a single pn junction serving as a light emitting region (see, e.g., Japanese Application Publication No. 2000-174,344). Supplied current in some occasions may be increased to increase light emitting power of the light emitting devices.

The duration of the light emitting devices, however, is largely depending on the amount of the supplied current. If the supplied current is increased as described above, there raises a problem that the duration rapidly becomes short.

It is an object of the invention to provide a semiconductor apparatus having a large light emitting output power without increasing any supplied current, in consideration of the current situation. It is also another object of the invention to provide a print head having the semiconductor apparatus and an image forming apparatus having the print head.

SUMMARY OF THE INVENTION

The foregoing objects are accomplished with an invented semiconductor apparatus including a substrate, and a plurality of semiconductor thin films formed on the substrate, each of the semiconductor thin films having a pn-junction, and electrodes of p-type and n-type for injecting carriers to the pn-junction, wherein the semiconductor thin films are formed so that all or a part of the pn-junctions are connected serially. With this semiconductor apparatus, as different from a semiconductor thin film constituted of a single pn-junction, the light emission is the summation of the light emission intensities of the entire pn-junctions connected in series, so that the light emitting intensity can be increased largely.

According to preferred embodiments of the invention, the semiconductor thin films can be overlapped respectively on the substrate via a passivation film, and can form a semiconductor thin film group arranged on the substrate. The semiconductor thin film group can be serially connected with another semiconductor thin film group. With this structure, a current is fed between the p-type electrode and the n-type electrode to the semiconductor thin films overlapped on the substrate to emit, from an upper side of the semiconductor thin film in an overlapping direction, light produced at the pn-junctions by carrier injection. The semiconductor thin films can be formed in an overlapping manner on the substrate via a conducting film allowing a current flowing through the semiconductor thin films. The conducting film may include a transparent conductor film or a metal layer.

BRIEF DESCRIPTION OF THE DRAWINGS

This invention may take physical form in certain parts and arrangements of parts, a preferred embodiment and method of which will be described in detail in this specification and illustrated in the accompanying drawings which form a part hereof, and wherein.

DESCRIPTION OF PREFERRED EMBODIMENTS

First Embodiment

Figure 1:
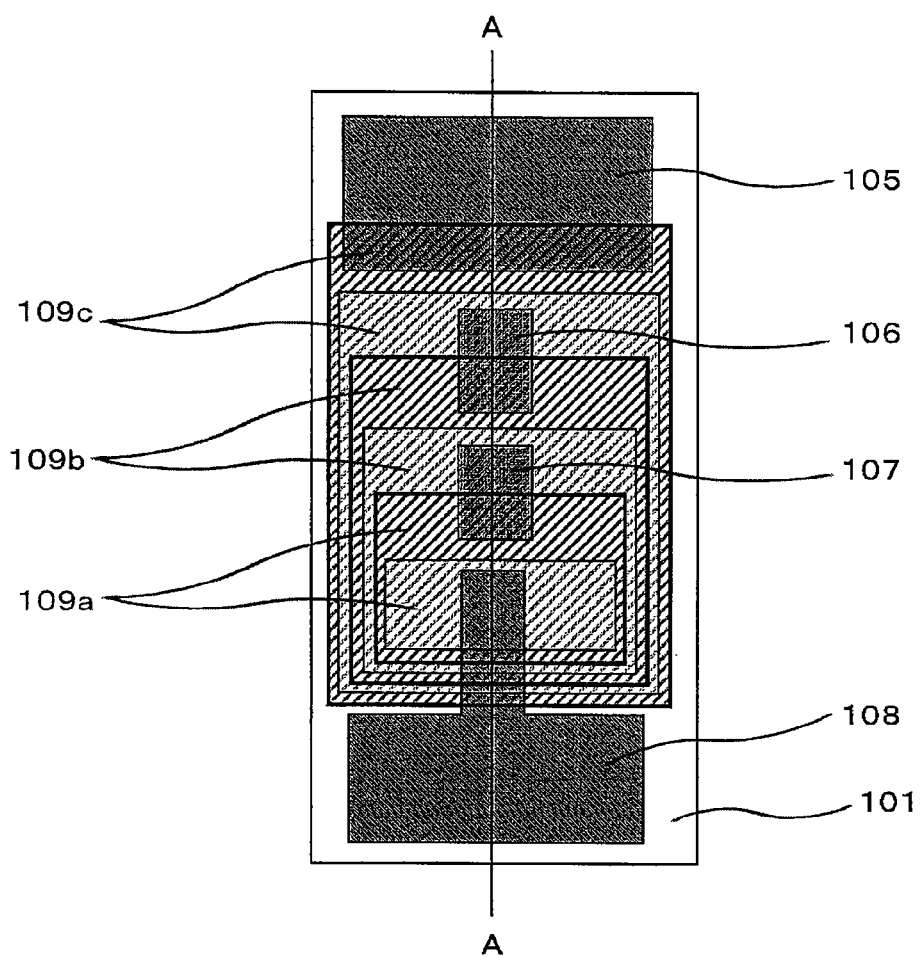
FIG. 1 is a top view showing a semiconductor apparatus according to the first embodiment of the invention.
Figure 2:
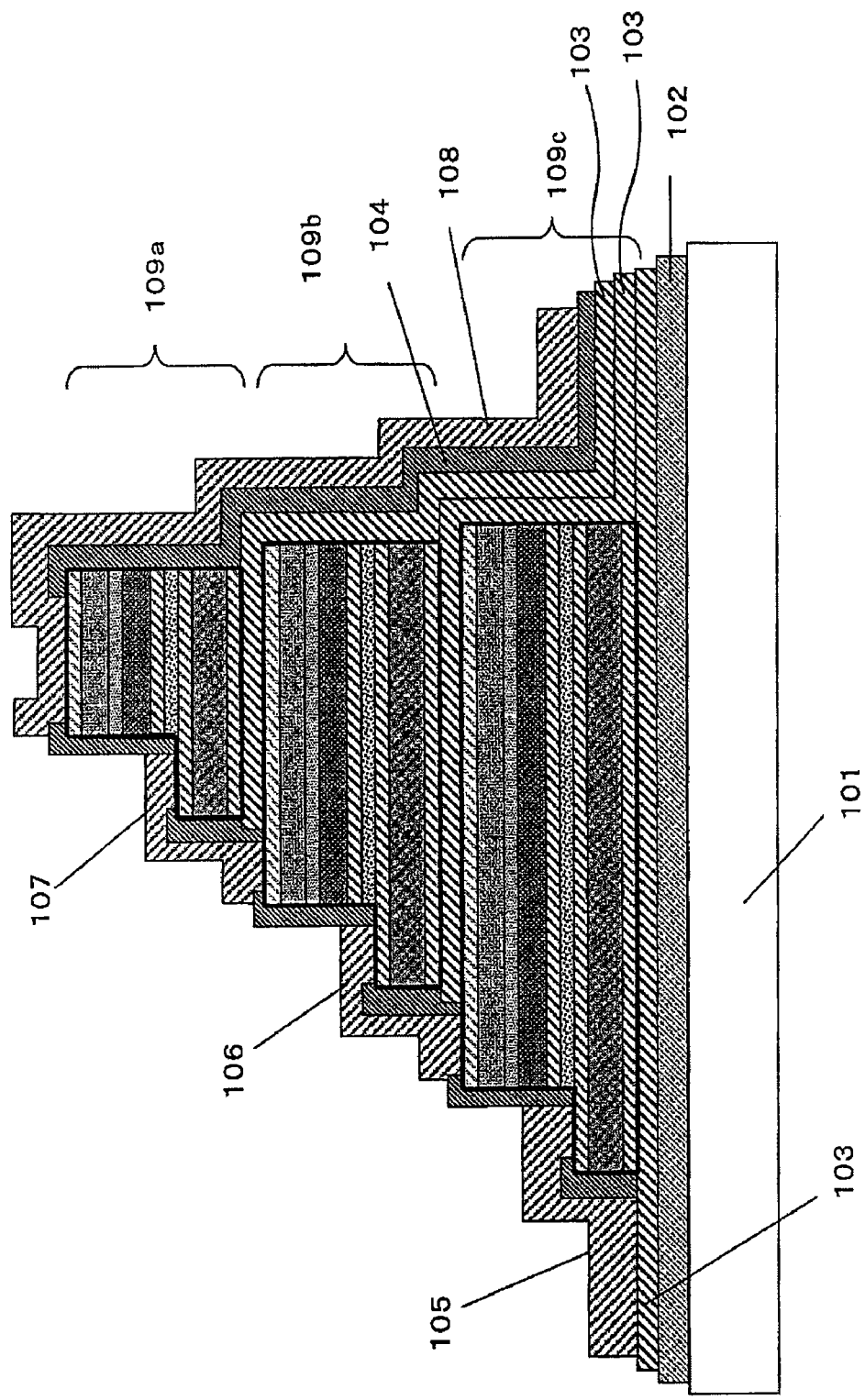
FIG. 2 is a cross section taken along A-A line of the semiconductor apparatus in FIG. 1.

FIG. 1 shows a top view of a semiconductor apparatus according to the first embodiment of the invention. FIG. 2 is a cross section taken along A-A line of the semiconductor apparatus in FIG. 1. The semiconductor apparatus illustrated in this embodiment has a reflecting layer 102 and a passivation film 103 on a first substrate 101. Three semiconductor thin films 109c, 109b, 109a, in this sequence from the bottom, are overlapped in placing the passivation film 103 between the films 109c, 109b as well as between the films 109b, 109a on the first substrate 101 via the passivation film 103. This semiconductor apparatus also includes an insulation layer 104, an electrode 105, an electrode interconnection 106, an electrode interconnection 107, and an electrode 108.

The substrate 101 is a plate shaped member for overlapped with, such as, e.g., the plural semiconductor thin films, the reflection layer 102, and the passivation film 104. The material making the substrate 101 is not specially limited but can be made of, e.g., Si. The reflection layer 102 is formed on the substrate 101 for reflecting light emitted out of the semiconductor thin films 109a to 109c. The material for making the reflection layer 102 is not specially limited as far as can reflect the emitted light, and a metal or metals can be exemplified. More specifically, exemplified are Ti, Al, TiAl, Ni, NiAl, TiPtAu, Au, CrAl, CrAu, Pd, CrPd, etc.

The passivation layer 103 is formed on the reflection layer 102 and formed between the semiconductor thin films 109c, 109b and between the semiconductor thin films 109b, 109a. The passivation film 103 serves as an insulator. The insulation film 104 prevents current from injecting out of regions other than designed regions. The passivation layer 103 and the insulation film 104 can be modified according to the number of layers and layouts of the semiconductor thin films 109a to 109c. It is to be noted that the passivation layers may be omitted between the semiconductor thin films, e.g., films 109a, 109b and 109b, 109c.

The electrode 105, the electrode interconnection 106, the electrode interconnection 107, and the electrode 108 flows the current as the injection of carrier to the connected semiconductor thin films 109a to 109c. The electrode 105 serves as an electrode contacting to the first conductive type contacting layer of the semiconductor thin film 109c and as an electrode pad. The electrode interconnection 106 is an interconnection for connecting a first conductive type contacting layer of the semiconductor thin film 109b to second conductive type contacting layer of the semiconductor thin film 109c. The electrode interconnection 107 is an interconnection for connecting a first conductive type contacting layer of the semiconductor thin film 109a to second conductive type contacting layer of the semiconductor thin film 109b. The electrode 108 serves as an electrode contacting to the second conductive type contacting layer of the semiconductor thin film 109a and as an electrode pad. In this embodiment, the electrode interconnection 106 and the electrode interconnection 107 are illustrated in a fashion that the semiconductor thin films 109a to 109c are directly connected, but connections can be made by forming interconnection layers after respective electrodes are formed on semiconductor thin films 109.

The semiconductor apparatus has a structure in which the three semiconductor thin films are overlapped as shown in FIGS. 1, 2, but this invention is not limited to this structure. For example, in a case that the three semiconductor thin films are formed as shown in FIGS. 1,2, the apparatus can be formed by setting the lower layer, the semiconductor thin film 109 having longer light emitting wavelength and by setting lights of three fundamental colors, red, green, and blue sequentially from the lower layer. In this structure, where the direction outputting the emitted light is a top direction in the overlapping direction, or namely, where the light emitted toward the semiconductor thin film 109a to the semiconductor thin film 109c, the light emitted out of the respective layers can be outputted without being absorbed by other layers, so that white color light can be emitted. A combination of light emission wavelengths of light emitted out of the light emitting regions of the respective semiconductor thin films can be changed in an appropriate manner. The number of the combined light emitting wavelengths, or the number of the semiconductor thin films can be two, four or more, and can be modified properly.

The semiconductor thin films 109 are overlapped on the substrate 101 in the sequence, from the lower layer, of the semiconductor thin film 109a, the semiconductor thin film 109b, and the semiconductor thin film 109c. Those semiconductor thin films 109a to 109c are in the same structures though having the different sizes.

Figure 3:
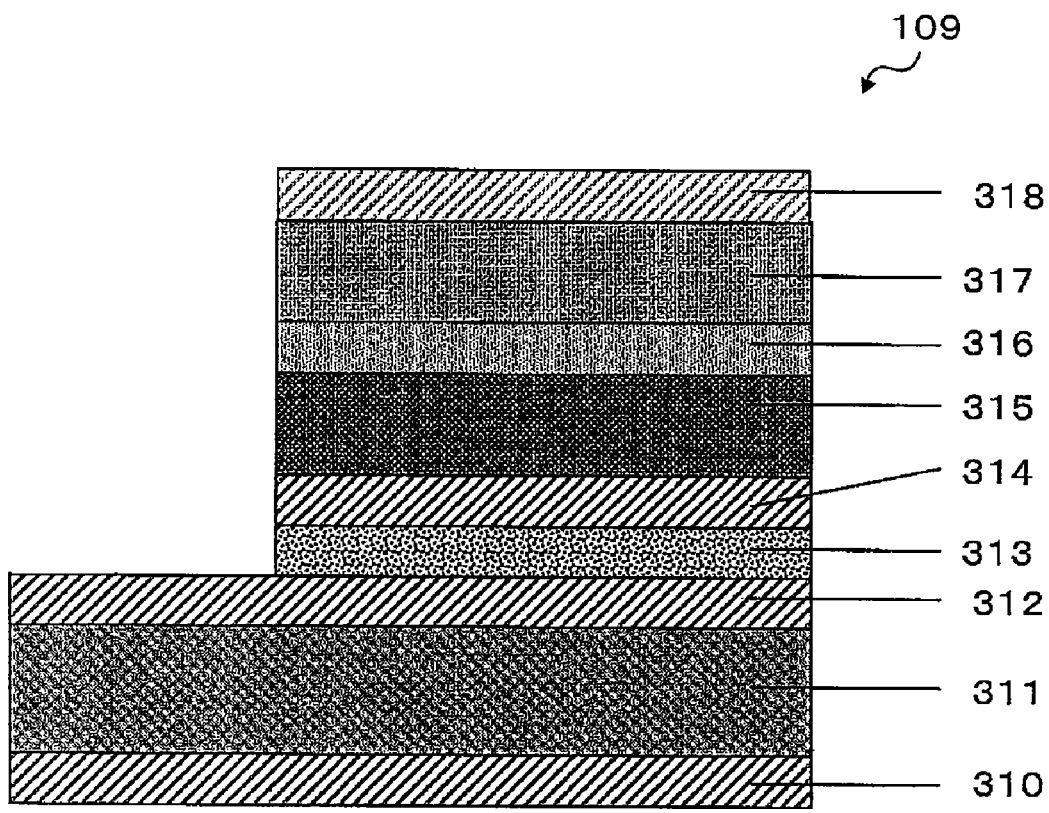
FIG. 3 is a diagram showing a semiconductor thin film portion of the semiconductor apparatus in FIG. 2.

Each of the semiconductor thin films 109a to 109c is formed by overlapping, as shown in FIG. 3 in the order from the lower layer, a first conductive type bonding layer 301 made of, e.g., an n-type GaAs layer, a first conductive type conducting layer 311 made of, e.g., an n-type $Al_sGa_{1-s}As$, a first conductive type contact layer 312 made of, e.g., an n-type GaAs layer, a first conductive type etching stopper layer 313 made of, e.g., an n-type InGaP layer, a first conductive type separation layer 314 made of, e.g., an n-type GaAs layer, a first conductive type clad layer 315 made of, e.g., an n-type $Al_xGa_{1-x}As$ layer, a first conductive type active layer 316 made of, e.g., an n-type $Al_yGa_{1-y}As$ layer, a second conductive type clad layer 317 made of, e.g., a p-type $Al_zGa_{1-z}As$ layer, and a second conductive type contact layer 318 made of, e.g., a p-type GaAs layer.

The semiconductor thin films 109a to 109c are formed in a predetermined shape by epitaxial growth and etching on a substrate different from the substrate 101, and are formed by transferring the thus formed semiconductor thin films 109a to 109c onto the substrate 101 having the reflection layer 102, and the passivation layer 103. The first conductive type etching stopper layer protects layers not to be etched, thereby allowing selective etching.

The first conductive type contact layer 312 is connected to an electrode pad or formed with interconnections. Where the first conductive type contact layer 312 is, for example, an n-type GaAs layer, the first conductive type contact layer 312 becomes the n-type electrode. On the other hand, the second conductive type contact layer 318 also becomes an electrode or is connected to an electrode pad or formed with interconnections in substantially the same way. Where the second conductive type contact layer 318 is, for example, a p-type GaAs layer, the second conductive type contact layer 318 becomes the p-type electrode.

The first conductive type active layer 316 has a pn-junction emitting light upon flowing current in use of the first conductive type contact layer 312 and the second conductive type contact layer 318. This first conductive type active layer 316 can be of the second conductive type, or can be a non-doped type. The first conductive type clad layer 315 and the second conductive type clad layer 317 are formed as to sandwich the first conductive type active layer 316, thereby injecting minority carriers to the first conductive type active layer 316 by flowing current.

The semiconductor apparatus has plural semiconductor thin films having this structure. The semiconductor apparatus has the structure that the reflection layer 102 is formed on the substrate and that the passivation film 103 is formed on a top surface in the overlapping direction of the reflection layer 102. Subsequently, the semiconductor thin film 109c formed at a substrate different from the substrate 101 as described above, is transferred, and then, the passivation film 103 is formed on the top surface in the overlapping direction except a portion at which the electrode interconnection 106 is formed.

Then, the semiconductor thin film 109b formed on a substrate different from the substrate 101 is transferred, and the passivation film 103 is formed on the top surface in the overlapping direction except a portion at which the electrode interconnection 107 is formed. The semiconductor thin film 109b formed on a substrate different from the substrate 101 is further transferred. After the insulation layer 104 is formed at portions except portions at which the electrode 105, the electrode interconnection 106, the electrode interconnection 107, and the electrode 108 are formed, the electrode 105, the electrode interconnection 106, the electrode interconnection 107, and the electrode 108 are formed.

The wavelength band of the light emitted from the semiconductor thin films 109a to 109c are not specifically limited. Materials to be used can be changed so that red light can be emitted out of, e.g., $(Al_xGa_{1-x})_yIn_{1-y}P$ and green and blue lights can be emitted out of nitride semiconductor based materials including one or more materials of any GaN, $Al_x$GaN, and $Ga_xIn_{1-x}N$. The following materials, other than the materials described above, as nitride based materials, may be used. Exemplified are one or more materials such as $GaAs_{1-x}N_x$, $GaP_{1-x}N_x$, $InAs_{1-x}N_x$, $InP_{1-x}N_x$, $InGa_{1-x}As_{1-y}N_y$, $InP_{1-x-y}As_xN_y$, $GaP_{1-x-y}As_xN_y$, and $In_xAl_{1-x}N$ ($1 \geq x \geq 0$, $1 \geq y \geq 0$). With respect to the quaternary materials, $Al_xGa_yAs_{1-x-y}P$ can be used. Furthermore, semiconductor materials from group II to group IV, as well as oxide semiconductor materials such as ZnO, can be used.

The semiconductor apparatus having the structure described above has the electrode 105 serving as the n-type electrode and the electrode 108 serving as the p-type electrode, and current flows forward at the pn-junctions of the semiconductor thin films 109a to 109c by flowing the current upon connecting the n-type electrode with the minus side and the p-type electrode with the plus side, thereby generating light at each pn-junction.

More specifically, the current is injected from the electrode 108 serving as the p-type electrode into the semiconductor thin film 109a via the second conductive type contact layer 318. The injected current flows the respective layers of the semiconductor thin film 109a, thereby emitting light at the pn-junction of the semiconductor thin film 109a.

The current flowing through the second conductive type contact layer 318 is injected into the semiconductor thin film 109b via the electrode interconnection 107. The electrode interconnection 107 serves as the n-type electrode with respect to the semiconductor thin film 109a, whereas serving as the p-type electrode with respect to the semiconductor thin film 109b. The electrode interconnection 107 serving as the p-type electrode for the semiconductor thin film 109b injects current to the semiconductor thin film 109b, and the current flows in substantially the same way as the semiconductor thin film 109a. Therefore, light comes out at the pn-junction of the semiconductor thin film 109b, and the current flows from the first conductive type contact layer 312 to the semiconductor thin film 109c via the electrode interconnection 106.

The electrode interconnection 106 at that time serves as the n-type electrode with respect to the semiconductor thin film 109b, but serves as the p-type electrode with respect to the semiconductor thin film 109c. The electrode interconnection 106 serving as the p-type electrode for the semiconductor thin film 109c injects current to the semiconductor thin film 109c, and the current flows in substantially the same way as the semiconductor thin films 109a, 109b. Therefore, light is emitted at the pn-junction of the semiconductor thin film 109c, and the current flows via the first conductive type contact layer 312 to the electrode 108.

In consideration of voltage drop at the pn-junctions of the respective semiconductor thin films 109a to 109c and voltage drop at the respective layers, a forward direction current flows, upon application of a voltage higher than those voltage drops, in the plural semiconductor thin films 109a to 109c which are connected in series as described above. Light emission is obtained substantially equally at each pn-junction of the respective semiconductor thin films 109a to 109c. That is, as different from a semiconductor thin film constituted of a single pn-junction, the light emission is the summation of the light emission intensities of the entire pn-junctions, so that the light emitting intensity can be increased largely.

The current flowing at that time is determined by the totality of the applied voltage, the entire junction resistances, and resistances of the semiconductor layers and interconnections. The voltage drop in the respective semiconductor thin films as the current flowing paths is, though depending on the current flowing, the voltage drops due to the resistance of the respective thin film materials and the junction resistances at pn-junctions. The voltage drop at the respective pn-junction during light emission operation depends on the semiconductor materials. For example, the semiconductor thin film having the $Al_xGa_{1-x}As$ as the active layer as described in this embodiment is about 1.5V. The semiconductor thin film having an InGaN/GaN multiple quantum well structure is about 3.5V. Contact resistance between the electrode and the contact layer of the semiconductor material is added, in addition to the junction resistances of the respective pn-junctions and the resistances of the respective semiconductor thin films. The applied voltage can be adjusted properly in consideration of those resistances.

Large light emitting intensity can be obtained with a current supplied in a smaller amount, where the semiconductor thin films 109a to 109c each having at least one pn-j unction formed on a substrate different from the substrate 101 is formed on the substrate 101 in a plural number, and where the semiconductor thin films 109a to 109c are connected in series via the electrodes. The semiconductor apparatus can be made very compact in terms of the structure because the apparatus has a structure overlapping the plural semiconductor thin films. The semiconductor apparatus can connect with low resistance by forming electrodes on the contact layers formed at the semiconductor thin films.

It is to be noted that the energy band gap of the contact layer can be frequently smaller than the energy band gap of the active layer. In such a situation, the contact layer becomes a layer absorbing light emitted out of the active layer. It is therefore desirable that the contact layer is formed thin as much as possible from a viewpoint of light absorption. If the contact layer is too thin, it is hard to expose the contact layer by etching.

The semiconductor apparatus described in the first embodiment is, as shown in FIG. 3, formed by overlapping the first conductive type conducting layer 311, the first conductive type contact layer 312, and the first conductive type etching stopper layer 313, in this order. Therefore, the first conductive type contact layer 312 can be formed to be very thin and uniform by forming the first conductive type contact layer 312 at a midway of the semiconductor thin films, stopping etching without damaging the first conductive type contact layer 312 in use of the first conductive type etching stopper layer 313, and removing a part of the first conductive type etching stopper layer 313 afterward.

This semiconductor apparatus can reflect the light emitted downward in the overlapping direction of the semiconductor thin films 109a to 109c to project the light upward in the overlapping direction of the semiconductor thin films 109a to 109c because the reflection layer 102 is formed on the substrate 101. The first conductive type contact layer 312 of the semiconductor thin films 109a to 109c are formed with a thin thickness as described above to reduce light absorption, so that the semiconductor apparatus can be made having a higher light emitting intensity.

Figure 4:
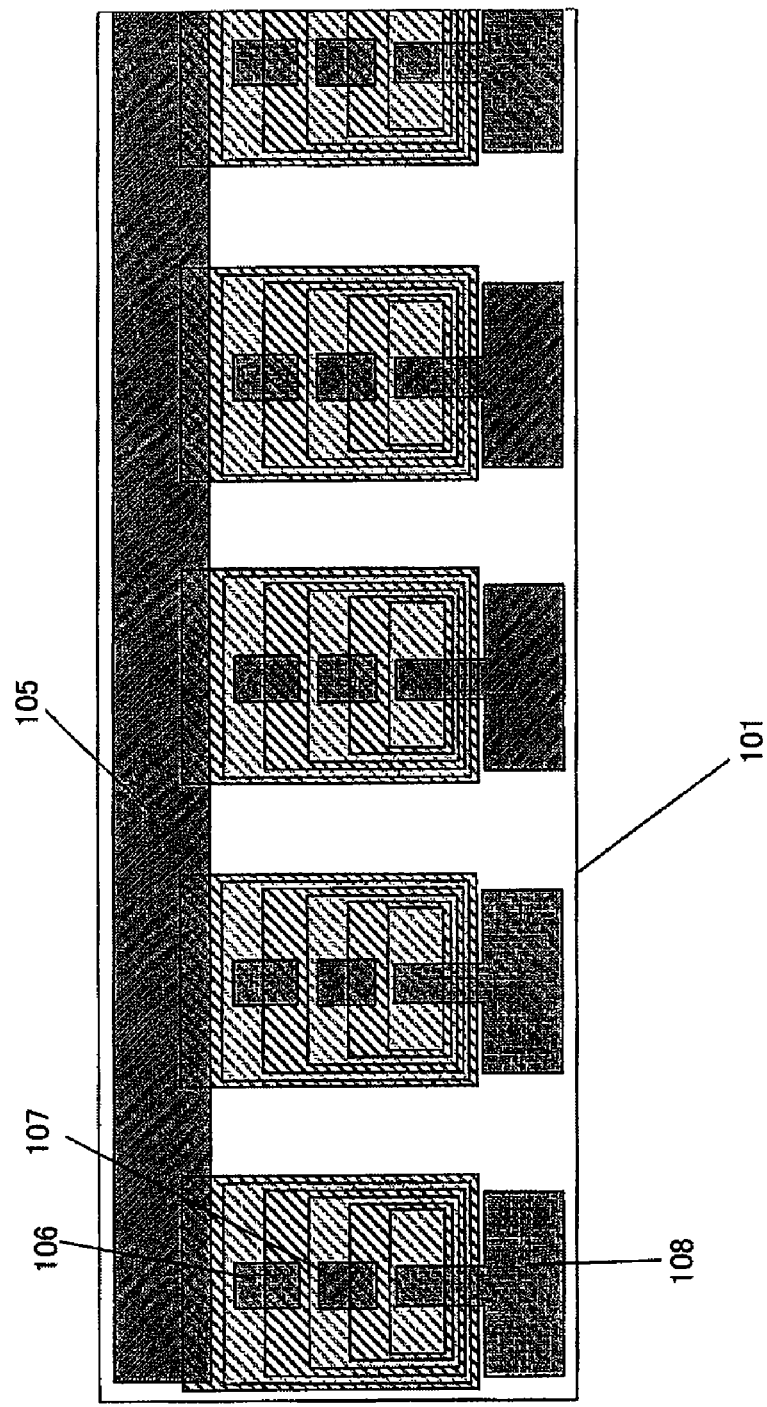
FIG. 4 is a diagram showing a situation that plural semiconductor thin film groups are arranged in which pn-junctions of plural semiconductor thin films shown in the first embodiment are connected in series.

The semiconductor apparatus described above has one set of the semiconductor thin film group in which pn-junctions of the plural semiconductor thin films formed on the substrate 101 are connected in series as shown in FIGS. 1 to 3, and furthermore, as shown in FIG. 4, the semiconductor thin film group can be arranged in a plural number on the substrate 101. This structure allows an arrangement of semiconductor thin film groups having a high light emitting intensity, and a light emitting device array is obtainable with high light emitting intensity. Where the light emitting intensity can be lowered, the current necessary for light emission can be reduced largely.

Figure 5:
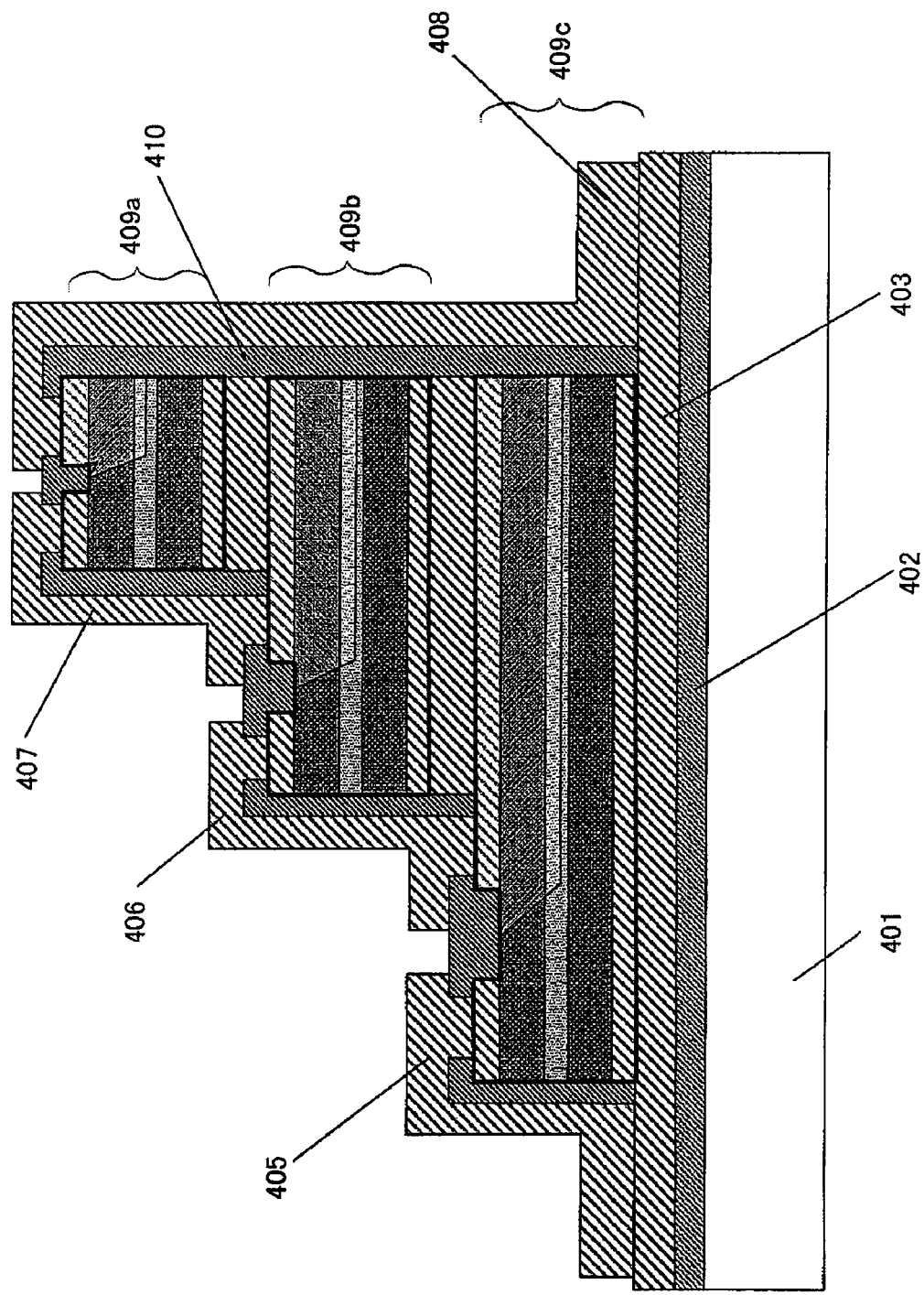
FIG. 5 is a diagram showing another example of the semiconductor apparatus according to the first embodiment of the invention.

The semiconductor thin film in the first embodiment described above, can be modified as follows. FIG. 5 shows a cross-sectional shape of the semiconductor apparatus. As shown in FIG. 5, a reflection film 402 and a passivation film 403 are formed on a substrate 401, and a semiconductor thin film 409c, a semiconductor thin film 409b, and a semiconductor thin film 409a are overlapped in this sequence on the top surface thereof in the overlapping direction via passivation films. This semiconductor apparatus further includes an insulation layer 404, an electrode 405, an electrode interconnection 406, an electrode interconnection 407, and an electrode 408.

Figure 6:
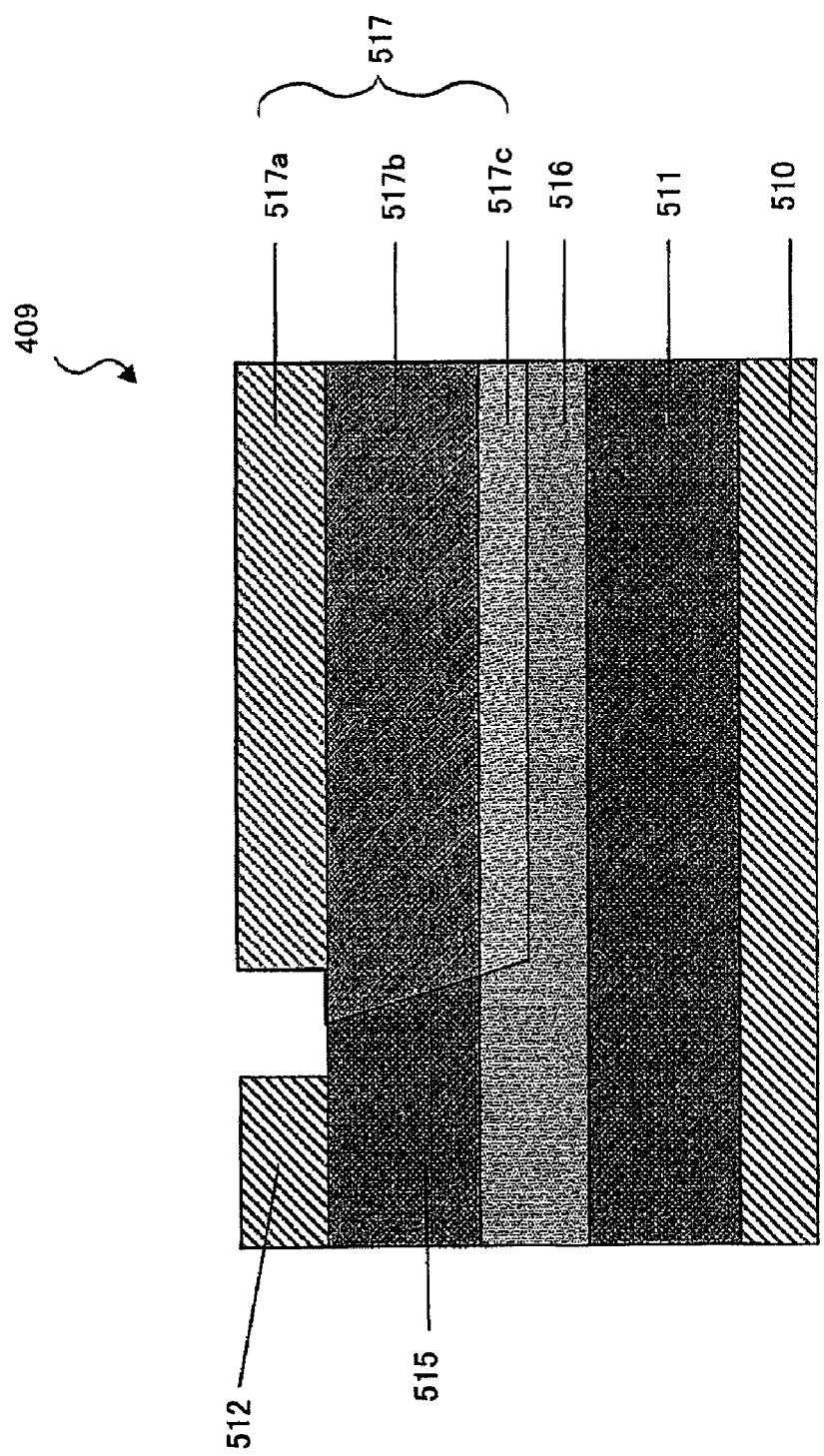
FIG. 6 is a diagram showing a semiconductor thin film portion of the semiconductor apparatus in FIG. 5.

The semiconductor thin films 409a to 409c are formed on a substrate different from the substrate 401, and as shown in FIG. 6, formed with a first conductive type bonding layer 510, a first conductive type contact layer 512, a first conductive type lower clad layer 511, a first conductive type upper clad layer 515, and a first conductive type active layer 516. Parts of the first conductive type contact layer 512, the first conductive type clad layer 515, and the first conductive type active layer 516 are made as impurity diffused regions by selective impurity doping according to impurity diffusions and modified to be second conductive type. That is, an impurity diffused region 517 is constituted of a second conductive type active layer 517c, a second conductive type clad layer 517b, and a second conductive type contact layer 517a. The semiconductor thin films 409a to 409c are formed, for example, by forming the first conductive type bonding layer 510, the first conductive type lower clad layer 511, the first conductive type active layer 516, the first conductive type upper clad layer 515, and the first conductive type contact layer 512 in this order, etching a part of the first conductive type contact layer 512, and selectively doping impurities as shown in FIG. 6.

The semiconductor apparatus, as shown in FIG. 5, has a structure that the pn-junctions in the active layers of the plural semiconductor thin films 409a to 409c are connected in series and that the pn-junctions of the respective semiconductor thin films 409a to 409c generate light in substantially the same way as in the semiconductor apparatus described above where the electrode 405 is used as the n-type electrode while the electrode 408 is used as the p-type electrode. Therefore, as different from a semiconductor thin film constituted of a single pn-junction, the light emission is the summation of the light emission intensities of the entire pn-junctions, so that the light emitting intensity can be increased largely.

In the semiconductor thin films as shown in FIG. 5, the pn-junctions are formed by selectively doping impurities. The number of the layers is less than that of the semiconductor apparatus shown in FIGS. 1 to 3, so that the apparatus can be made smaller. The contact portion of the electrode can be formed using the same surface and the same semiconductor layer, so that it is easy to form such a structure having the serial connections. Although in the above description of the embodiment the passivation films are formed among the semiconductor thin films, the respective semiconductor thin films can be overlapped without forming any passivation film among the respective semiconductor thin films.

Although in the first embodiment, $Al_sGa_{1-s}A_s$ is exemplified as a material for semiconductor thin film, such materials of the semiconductor thin films are not limited in this invention. For example, one or more kinds of AlInGaP, InGaAsP, InP, GaN, AlGaN, InGaN, and InN can be chosen. The following materials, other than the materials described above, as nitride based materials, may be used. Exemplified are one or more materials such as $GaAs_{1-x}N_x$, $GaP_{1-x}N_x$, $InAs_{1-x}N_x$, $InP_{1-x}N_x$, $InGa_{1-x}As_{1-y}N_y$, $InP_{1-x-y}As_xN_y$, $GaP_{1-x-y}As_xN_y$, and $In_xAl_{1-x}N$ ($1 \geq x \geq 0$, $1 \geq y \geq 0$). With respect to the quaternary materials, $Al_xGa_yAs_{1-x-y}P$ can be used. Furthermore, semiconductor materials from group II to group IV, as well as oxide semiconductor materials such as ZnO, can be used.

In this embodiment, described is the apparatus formed by overlapping the semiconductor thin films of the same structure, but materials for different wavelengths may be overlapped. The first substrate material is described as an Si substrate, the substrate can be, e.g., glass, plastic, ceramic, or metal. The positions of the electrode pads and the electrode contacts can be modified.

Second Embodiment

A semiconductor apparatus described in the second embodiment has semiconductor thin films having a structure in which the light emitting regions of the semiconductor apparatus described in the first embodiment are restricted to prescribed regions. Hereinafter, the semiconductor apparatus is described with reference to FIGS. 7, 8.

Figure 7:
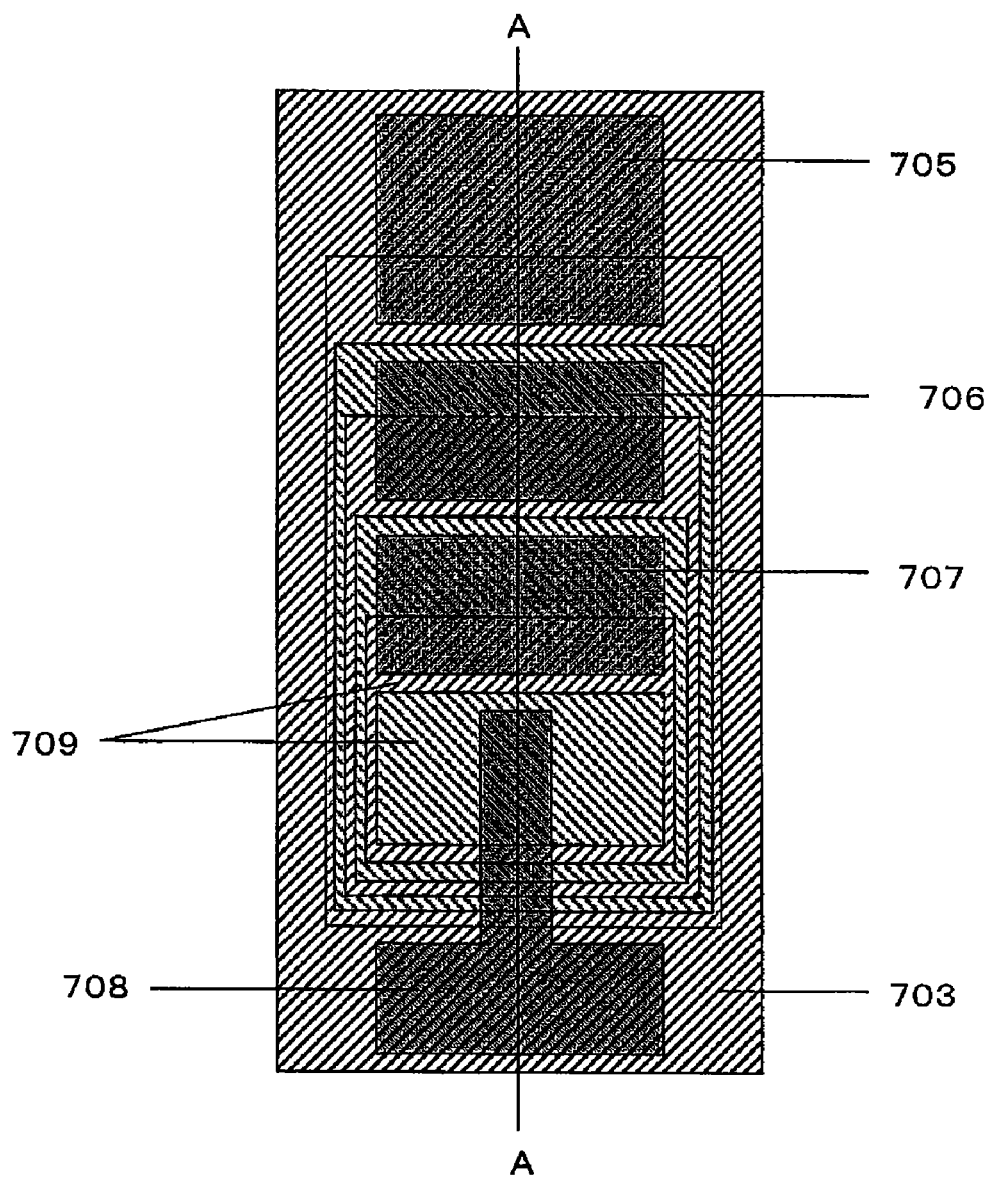
FIG. 7 is a top view showing a semiconductor apparatus according to the second embodiment of the invention.
Figure 8:
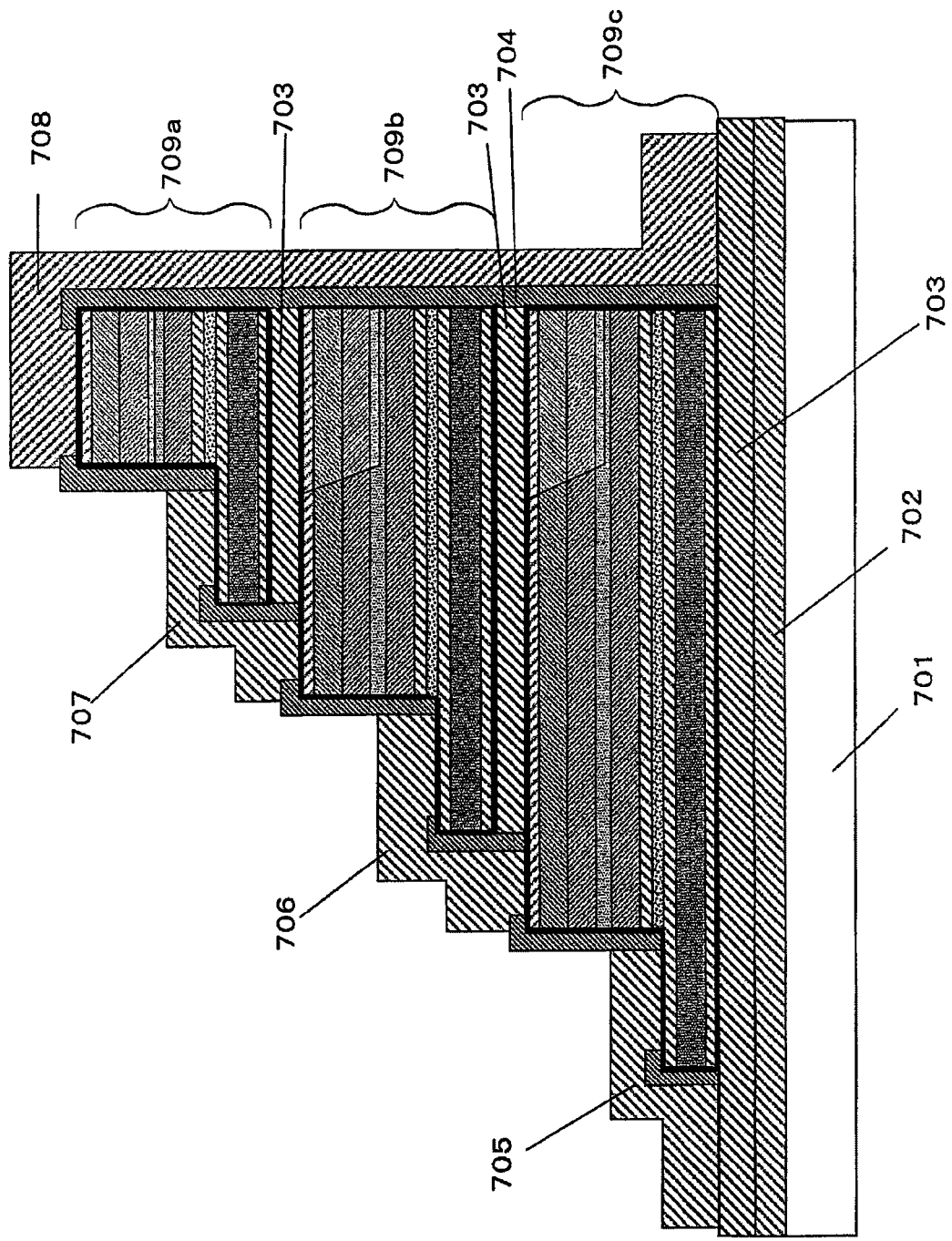
FIG. 8 is a cross section taken along A-A line of the semiconductor apparatus in FIG. 7.

FIG. 7 is a top view showing the invented semiconductor apparatus described in the second embodiment. FIG. 8 is a cross section taken along A-A line of the semiconductor apparatus shown in FIG. 7. The semiconductor apparatus described in the second embodiment has a reflection layer 702 and a passivation film 703 on a substrate 701. A semiconductor thin film 709c, a semiconductor thin film 709b, and a semiconductor thin film 709a are overlapped in this sequence on the top surface thereof in the overlapping direction via passivation films 703. This semiconductor apparatus further includes an insulation layer 704, an electrode 705, an electrode interconnection 706, an electrode interconnection 707, and an electrode 708. Those layers, electrodes, and electrode interconnections are having substantially the same structure as those in the first embodiment, and a detailed description is omitted for the sake of simplicity.

Figure 9:
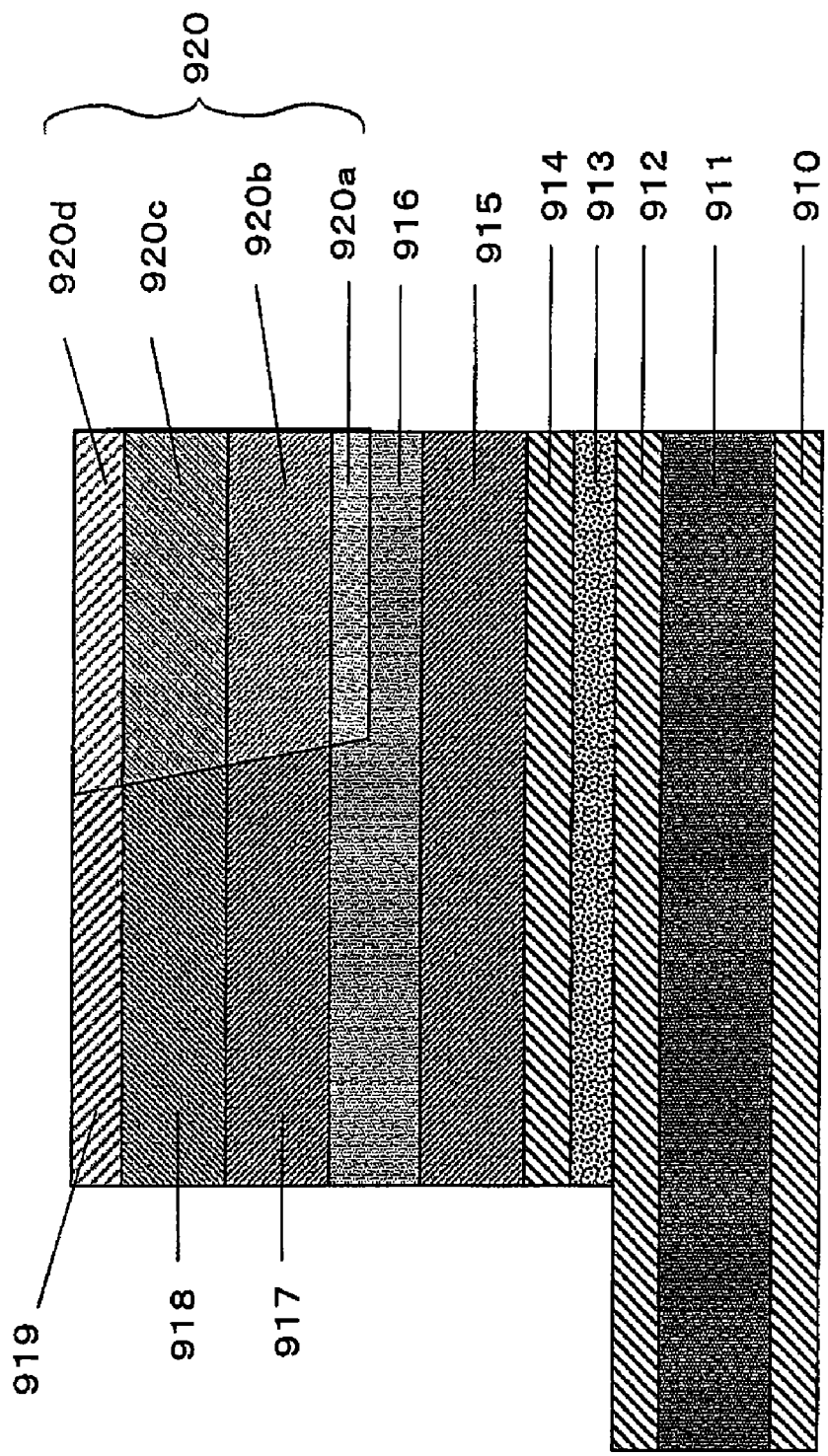
FIG. 9 is a diagram showing a semiconductor thin film portion of the semiconductor apparatus in FIG. 8.

The semiconductor thin films 709a to 709c, as shown in FIG. 9, have a first conductive type bonding layer 910, a first conductive type conducting layer 911, a first conductive type contact layer 912, a first conductive type etching stopper layer 913, a first conductive type separation layer 914, a first conductive type lower clad layer 915, a first conductive type active layer 916, a first conductive type upper clad layer 917, a second conductive type conducting layer 918, and a second conductive type contact layer 919.

For example, Each of the semiconductor thin films 709a to 709c is formed by overlapping the first conductive type bonding layer 910 made of, e.g., an n-type GaAs layer, the first conductive type conducting layer 911 made of, e.g., an n-type $Al_sGa_{1-s}As$, the first conductive type contact layer 912 made of, e.g., an n-type GaAs layer, the first conductive type etching stopper layer 913 made of, e.g., an n-type InGaP layer, the first conductive type separation layer 914 made of, e.g., an n-type GaAs layer, the first conductive type clad layer 915 made of, e.g., an n-type $Al_xGa_{1-x}As$ layer, the first conductive type active layer 916 made of, e.g., an n-type $Al_yGa_{1-y}As$ layer, the second conductive type upper clad layer 917 made of, e.g., a p-type $Al_zGa_{1-z}As$ layer, the second conductive type conducting layer 918 made of, e.g., a p-type $Al_tGa_{1-t}As$, and the second conductive type contact layer 919 made of, e.g., p-type GaAs layer. It is desirable herein to satisfy a condition that x, z>y, s, t>y. According to this structure, this condition is equivalent to render the energy band gaps of, at least, the first conductive type lower clad layer 915, the first conductive type upper clad layer 917, the first conductive type conducting layer 911, and second conductive type conducting layer 918 set larger than the energy gap of the first conductive type active layer 916.

A high concentration diffused region 920 reaching an interior of the first conductive type active layer is formed by doping impurities by means of selective impurity doping or the like to parts of the first conductive type active layer 916, the second conductive type upper clad layer 917, the second conductive type conducting layer 918, and the second conductive type contact layer 919. That is, the high concentration diffused region is constituted of a high concentration diffused active layer 920a, a high concentration diffused clad layer 920b, a high concentration diffused conducting layer 920c, and a high concentration diffused contact layer 920d. The high concentration diffused region 920 is entirely of the second conductive type from the high concentration diffused contact layer 920d located topmost to the high concentration diffused active layer 920a.

With such a structure, the semiconductor thin films 709a to 709c are formed with pn-junctions formed at the boundary between the second conductive type conducting layer 918 and the first conductive type clad layer 917 and inside the active layer. If the energy band gaps are compared between the two pn-junctions, the pn-junction of the boundary between the second conductive type conducting layer 918 and the first conductive type clad layer 917 has a larger energy band gap than the pn-junction in the active layer. Therefore, larger energy is needed for light emission at the pn-junction of the boundary between the second conductive type conducting layer 918 and the first conductive type clad layer 917. Current effectively flows inside the impurity diffused region 920 by adequately raising the doped concentration of the impurity diffused region 920 and lowering the voltage drop at the route formed in the active layer reaching the pn-junction face. The current therefore flows through the pn-junction in the active layer, and the pn-junction emits light. That is, the region restricted as the light emitting region generates light upon supply of current.

The semiconductor apparatus having the structure described above has, in substantially the same way as those in the first embodiment, the electrode 705 serving as the n-type electrode and the electrode 708 serving as the p-type electrode, and the current is injected by connecting the n-type electrode with the minus side and the p-type electrode with the plus side. This connection renders current flow forward at the pn-junctions of the semiconductor thin films 709a to 709c, thereby generating light at each pn-junction of the impurity diffused region 920 of the semiconductor thin films 709a to 709c.

As described above, the semiconductor apparatus can have the structure in which current flows only in a prescribed region as in the semiconductor thin films 709a to 709c described in this embodiment by forming the second conductive type contact layer 919 and the second conductive type conducting layer 918 above the first conductive type clad layer 917 in the overlapping direction, and forming the impurity diffused region 920 extending from the second conductive type contact layer 919 to the first conductive type active layer 916. The light emitting region of each of semiconductor thin films 709a to 709c can be limited to the prescribed region, even where plural semiconductor thin films 709a to 709c are overlapped. By connecting in series the pn-junctions upon overlapping films, the light emission is the summation of the light emission intensities of the entire pn-junctions, as different from a semiconductor thin film constituted of a single pn-junction, so that the light emitting intensity can be increased largely.

For example, the light emitting regions of the semiconductor thin films 709a to 709c can be formed at corresponding positions. Thus, the current density of the light emitting region can be made higher by arranging the light emitting regions to the limited positions, and the light emitting efficiency as well as the light emitting intensity can be raised. Because almost all of the light emitting regions can be overlapped, the area for emitting a monotone light can be made smaller, and light emitting color of white light emission or the like can be easily controlled by mixing emitted lights having different light emission wave lengths where the apparatus has a structure that plural semiconductor thin films for emitting different wavelength lights are overlapped.

Figure 10:
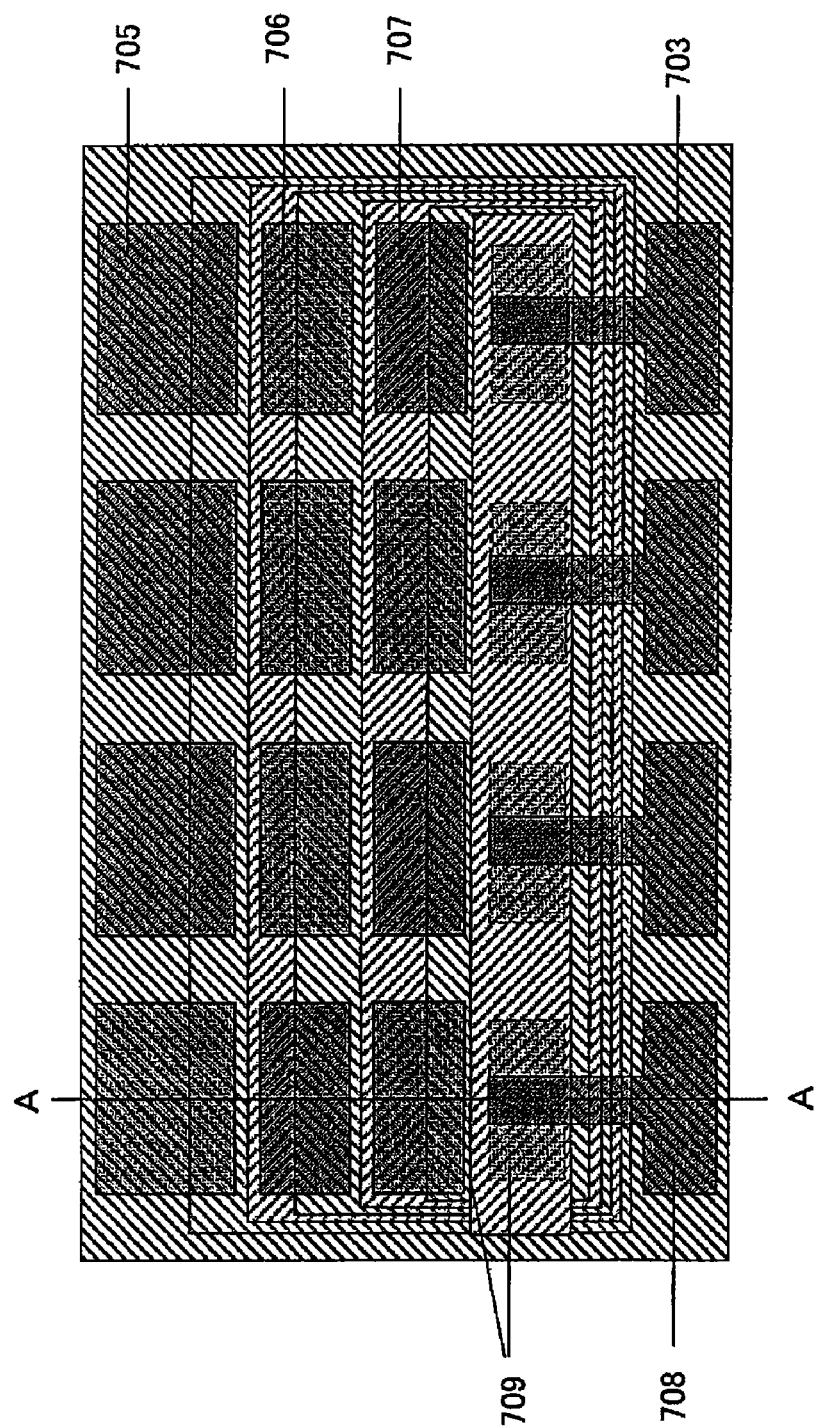
FIG. 10 is a diagram showing another example of the semiconductor apparatus according to the second embodiment of the invention.

The semiconductor apparatus described above, as described in reference to FIGS. 7 to 9, includes one set of the semiconductor thin film group in which the pn-junctions of the plural semiconductor thin films are connected in series on the substrate 701, but as shown in FIG. 10, the semiconductor apparatus may have plural sets of the semiconductor thin film groups on the substrate. This structure allows an arrangement of the semiconductor thin film groups of a high light emitting intensity, thereby producing a light emitting device array having the high light emitting intensity. Where the light emitting intensity can be reduced, the current necessary for emitting light can be saved greatly.

Third Embodiment

Figure 11:
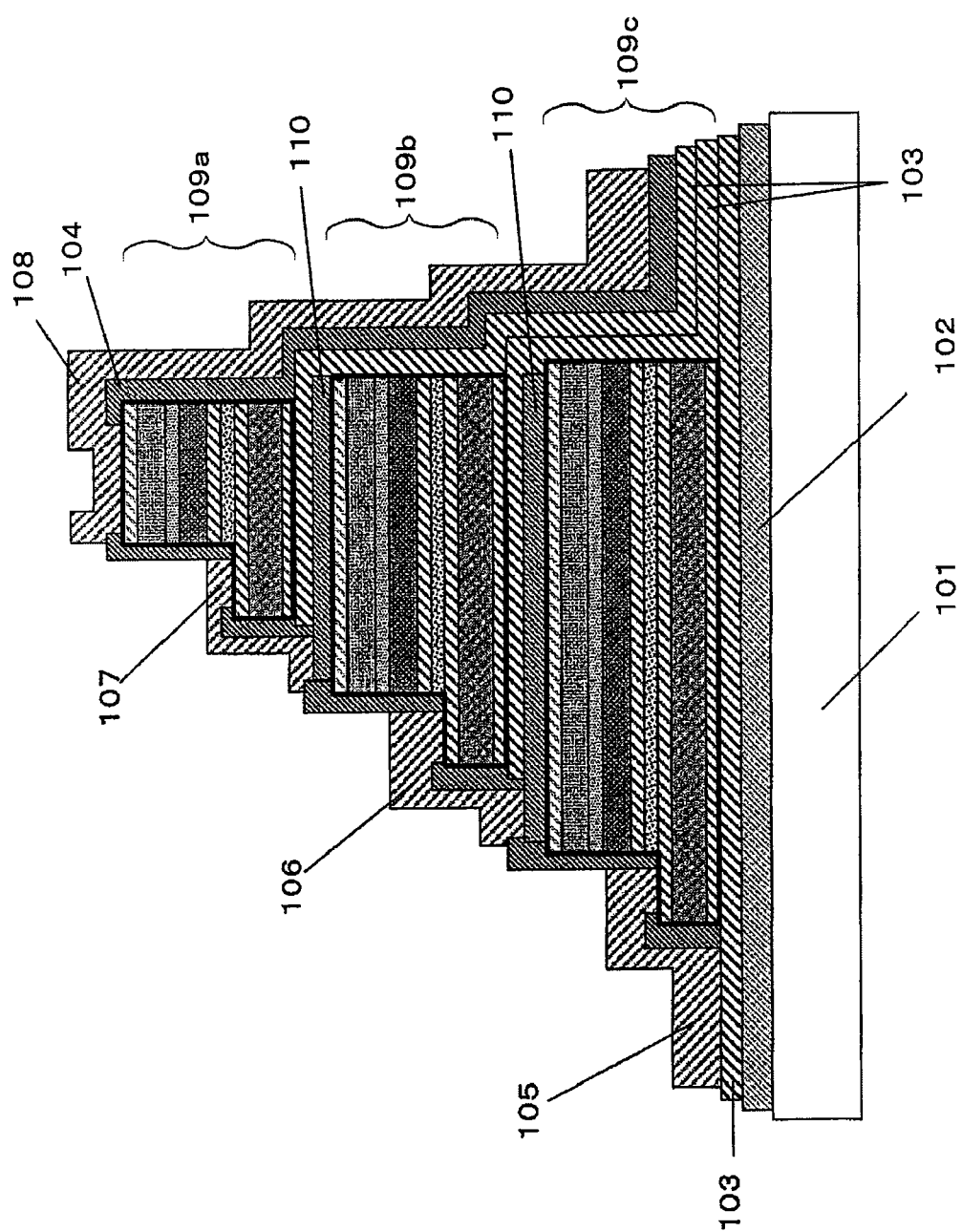
FIG. 11 is a cross section showing a semiconductor apparatus according to the third embodiment of the invention.

A semiconductor apparatus described in this embodiment has, as shown in FIG. 11, a conducting layer 110 placed between each of the semiconductor thin films 109a to 109c and the passivation film 103 of the semiconductor apparatus in which the semiconductor thin films 109a to 109c are overlapped via the passivation film 103 described in the first embodiment. The conducting layer 110 is a layer made of a conducting material, and sole, overlapped, hybrid, or alloy material or materials including any elements of Au, Ni, Ge, Pt, Ti, In, Al, Cu, or transparent electrode materials such as ITO film or ZnO film can be exemplified as the conducting layer. This conducting layer desirably has a thickness of 50 nm to 300 nm. If the layer has a thickness equal to or more than 300 nm, the transparency is largely reduced, whereas if the layer has a thickness equal to or less than 50 nm, the resistance is largely increased.

With the semiconductor apparatus described above, current flows through the semiconductor thin films 109a to 109c, and the pn-junctions of the respective semiconductor thin films 109a to 109c emit light. Current in this structure can be diffused widely in the second conductive type contact layer 318 in the semiconductor thin films 109a to 109c by placing the conducting layer 110 between each of the semiconductor thin films 109a to 109c and the passivation film 103.

The semiconductor apparatus thus described in this embodiment allows the current to be scattered widely in the second conductive type contact layer 318 in the semiconductor thin films 109a to 109c by placing the conducting layer 110 between each of the semiconductor thin films 109a to 109c and the passivation film 103, thereby rendering light emit efficiently. Upon using a metal for the conducting layer 110, the light emitted downward in the overlapping direction reflects back to the metal, thereby preventing light from emitting out of a lower portion in the overlapping direction, and thereby increasing the light emitting intensity. By employing the transparent electrode material to the conducting layer 110, current can be diffused widely in the second conductive type contact layer in the semiconductor thin films 109a to 109c and can maintain light transmission through the conducting layer 110.

Fourth Embodiment

A semiconductor apparatus described in this fourth embodiment is formed with a conducting layer on the semiconductor thin film, and another semiconductor thin film is bonded on the conducting layer. Hereinafter, this semiconductor apparatus is described in reference to FIGS. 12, 13.

Figure 12:
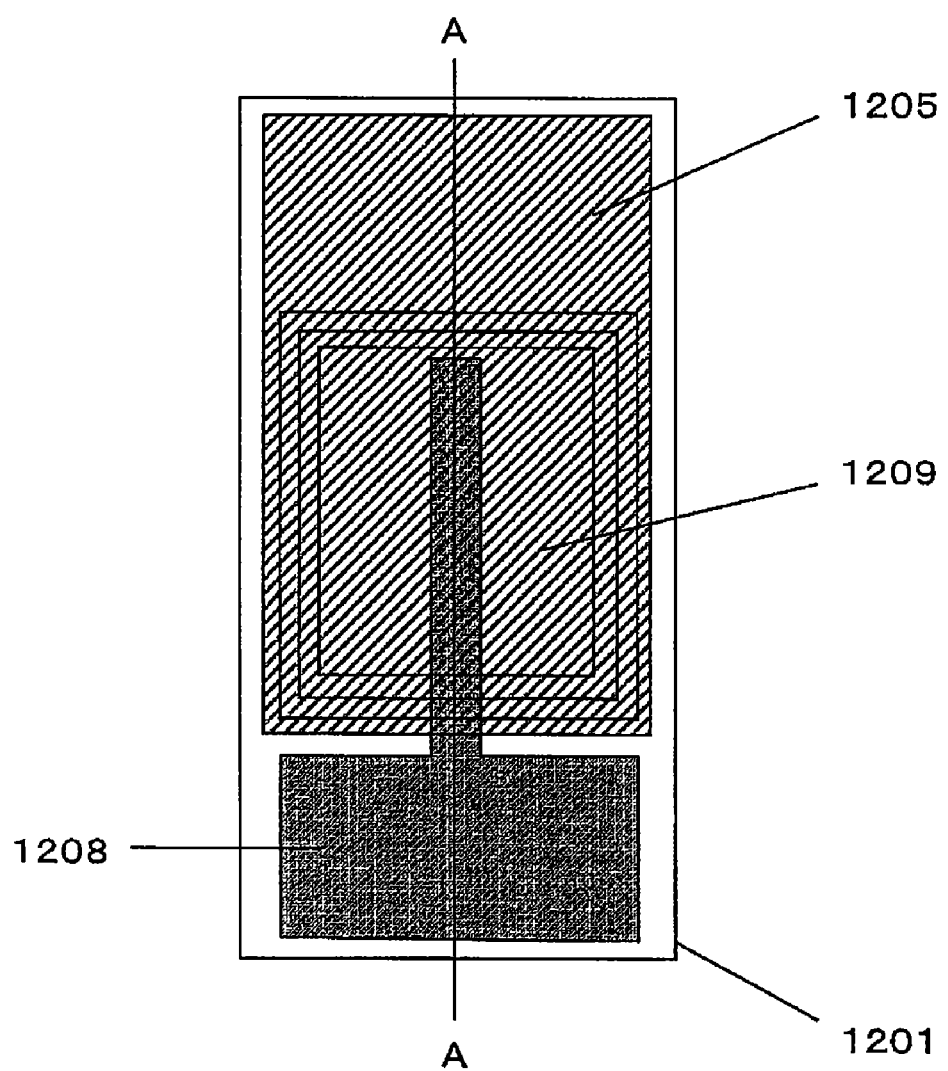
FIG. 12 is a top view showing a semiconductor apparatus according to the fourth embodiment of the invention.
Figure 13:
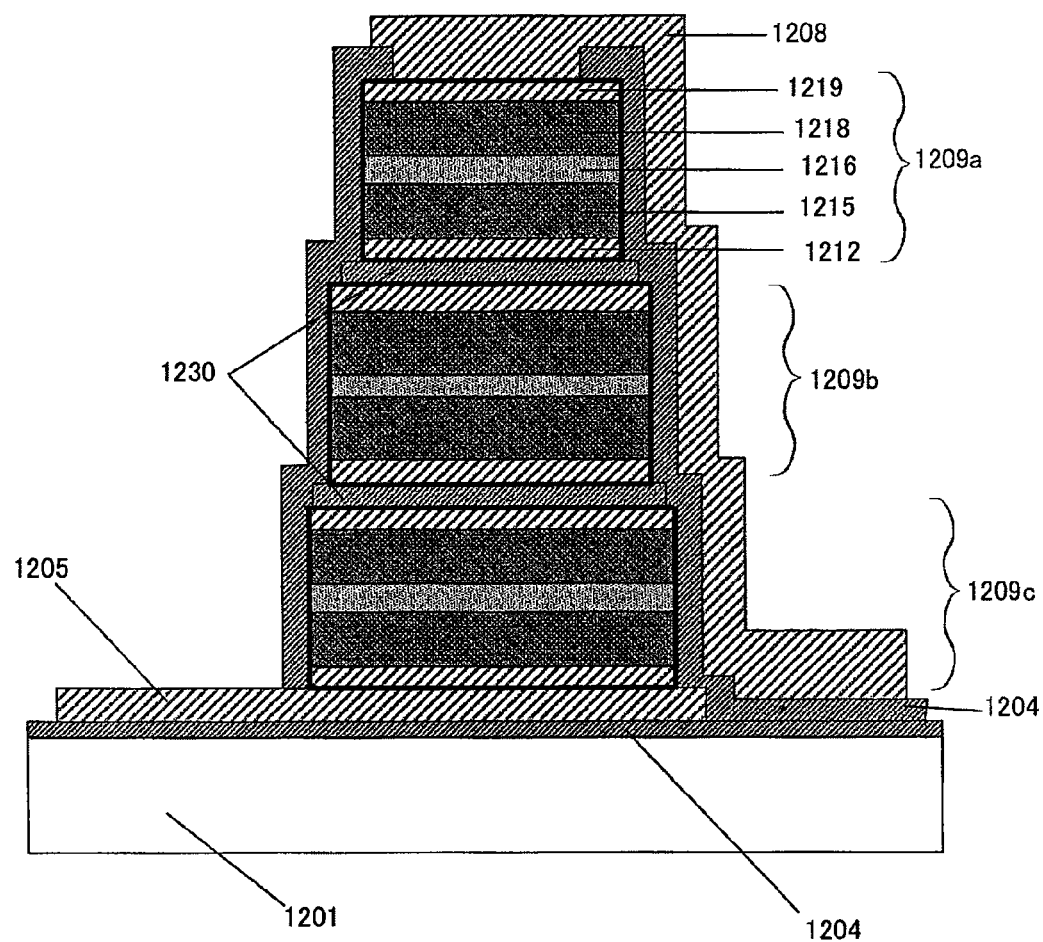
FIG. 13 is a cross section taken along A-A line of the semiconductor apparatus in FIG. 12.

FIG. 12 is a top view showing a semiconductor apparatus according to the fourth embodiment of the invention. FIG. 13 is a cross section taken along A-A line of the semiconductor apparatus in FIG. 12. The semiconductor apparatus illustrated in this fourth embodiment has an insulation layer 1204 on a substrate 1201. An electrode 1205 is formed on the insulation layer 1204 in the overlapping direction. Semiconductor thin films 1209c, 1209b, 1209a are overlapped above the electrode 1205 in the overlapping direction via a conducting layer 1230. An electrode 1208 is formed on the films 1209a to 1209c. The respective layers, electrodes, electrode interconnections are substantially the same as those in the first embodiment, and detailed description of those members are omitted for the sake of simplicity.

The semiconductor thin films 1209a to 1209c include a first conductive type contact layer 1212, a first conductive type clad layer 1215, a first conductive type active layer 1216, a second conductive type clad layer 1218, and a second conductive type contact layer 1219. By flow of the current through the semiconductor thin films 1209a to 1209c, the pn-junction in the first conductive type active layer 1216 generates light.

The conducting layer 1230 is a layer made of a conducting material, in the same way as the conducting layer in the third embodiment, and sole, overlapped, hybrid, or alloy material or materials including any elements of Au, Ni, Ge, Pt, Ti, In, Al, Cu, or transparent electrode materials such as ITO film or ZnO film can be exemplified as the conducting layer. This conducting layer desirably has a thickness of 50 nm to 300 nm. If the layer has a thickness equal to or more than 300 nm, the transparency is largely reduced, whereas if the layer has a thickness equal to or less than 50 nm, the resistance is largely increased.

The semiconductor apparatus having the structure described above has the electrode 1205 serving as the n-type electrode and the electrode 1208 serving as the p-type electrode, and current flows forward at the pn-junctions of the semiconductor thin films 1209a to 109c by flowing the current upon connecting the n-type electrode with the minus side and the p-type electrode with the plus side, thereby generating light at each pn-junction.

More specifically, the current is injected from the electrode 1208 serving as the p-type electrode into the semiconductor thin film 1209a via the second conductive type contact layer 1219. The injected current flows the respective layers of the semiconductor thin film 1209a, thereby emitting light at the pn-junction of the semiconductor thin film 1209a.

The current flowing through the second conductive type contact layer 1219 of the semiconductor thin film 1209a is injected into the semiconductor thin film 1209b via the conducting layer 1230. This current flows through the respective layers in the same way as in the semiconductor thin film 1209a, and generates light at the pn-junction of the semiconductor thin film 1209b. The current flowing through the second conductive type contact layer 1219 of the semiconductor thin film 1209b is injected into the semiconductor thin film 1209c via the conducting layer 1230. This current flows through the respective layers in the same way as in the semiconductor thin film 1209b, and generates light at the pn-junction of the semiconductor thin film 1209c.

With respect to those semiconductor thin films 1209a to 1209c, in consideration of voltage drop at the pn-junctions of the respective semiconductor thin films 1209a to 1209c and voltage drop at the respective layers, a forward direction current flows in the plural semiconductor thin films 1209a to 1209c which are connected in series as described above upon application of a voltage higher than those voltage drops. Light emission is obtained substantially equally at each pn-junction of the respective semiconductor thin films 1209a to 1209c. That is, as different from a semiconductor thin film constituted of a single pn-junction, the light emission is the summation of the light emission intensities of the entire pn-junctions, so that the light emitting intensity can be increased largely. The semiconductor thin films 1209a to 1209c overlapped on the apparatus can be made with a simpler structure. The electrode interconnections other than the electrodes 1205, 1208 can be made easier, and the semiconductor apparatus can utilize this simple, smaller structure.

The semiconductor apparatus described in this fourth embodiment is not limited to one having the single set of the semiconductor thin film groups in which the pn-junctions of the plural semiconductor thin films on the substrate 1201 are connected in series as shown in FIG. 12 and FIG. 13. For example, as shown in FIG. 14, 15, the semiconductor apparatus can be a semiconductor hybrid apparatus having plural semiconductor elements made of semiconductor thin films on the substrate 1401 and some drive elements having a drive circuit or circuits.

Figure 14:
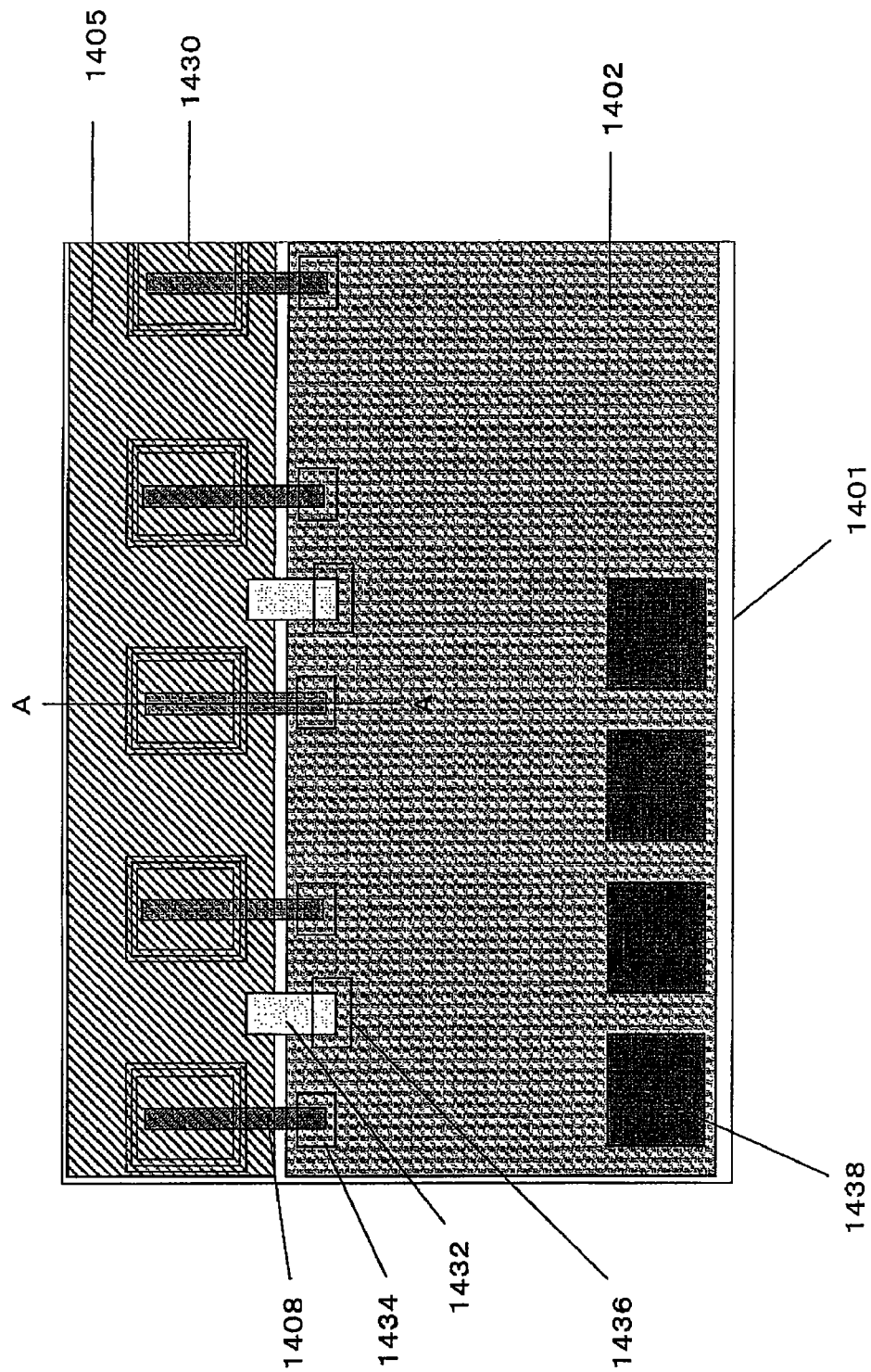
FIG. 14 is a top view showing a semiconductor hybrid apparatus, as another example of the semiconductor apparatus according to the fourth embodiment of the invention.
Figure 15:
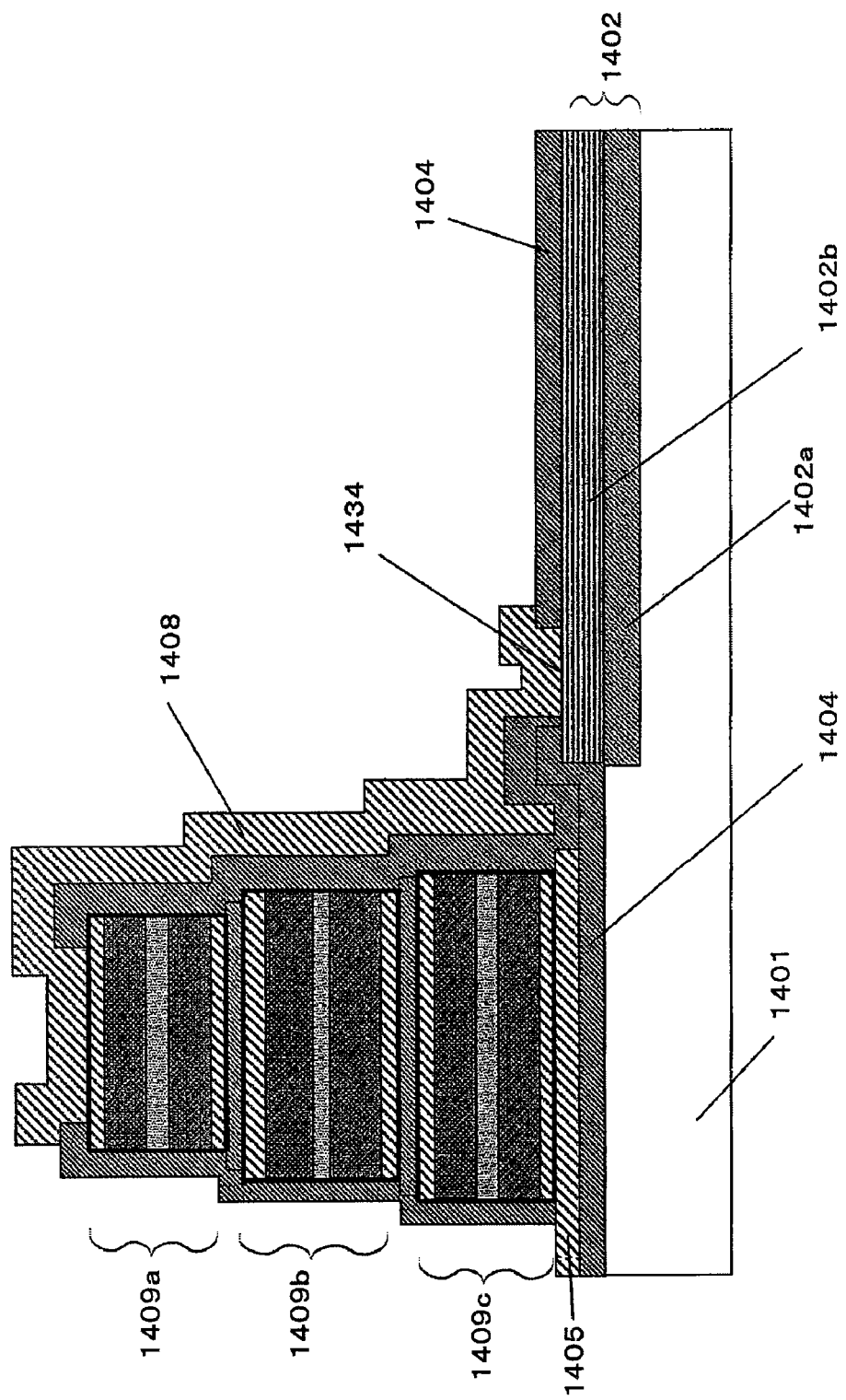
FIG. 15 is a cross section taken along A-A line of the semiconductor hybrid apparatus in FIG. 14.

FIG. 14 shows another example of the semiconductor apparatus described in the fourth embodiment, and illustrates a top view of a semiconductor hybrid apparatus having plural semiconductor elements and some drive elements. FIG. 15 is a cross section taken along A-A line of the semiconductor hybrid apparatus shown in FIG. 14. The semiconductor hybrid apparatus is formed with a region at which the semiconductor element 1430 is arranged on the substrate 1401 and a region at which the drive element 1402 having a drive circuit connected to the semiconductor element 1430.

The semiconductor element 1430 is made of a semiconductor thin film group in which plural pn-junctions are connected in series in substantially the same way as those in the semiconductor apparatus described in the fourth embodiment, and the plural semiconductor elements 1430 are arranged in a line. An electrode 1405 serving as the first conductive type electrode of the semiconductor element 1430 is formed at a region at which the semiconductor element 1430 is arranged, between the substrate 1401 and the semiconductor element 1430. An electrode 1408 serving as the second conductive type electrode is formed on a topmost surface of the semiconductor element 1430, and is connected to the drive element 1402 via a connection region 1434. The electrode 1405 and the drive element 1402 are connected via a connection region 1436.

The drive element 1402 has a circuit element group 1402*a* formed in the substrate 1401 and a multilayer interconnection 1402*b* for the circuit element group 1402*a* as shown in FIG. 15. An insulation layer 1404 is formed on the substrate 1401. The drive element 1402 is formed with an output input pad 1438 for transmitting control data of the power supply and the semiconductor elements. The data for control of the semiconductor element 1430 is transmitted to the drive circuit in the drive element 1402 by output and input of the data via the output input pad 1438, and the semiconductor element 1430 can be controlled after the data is processed in the circuit. The drive element 1402 is also controlled to be turned on and off.

By rendering the light emitting element and the drive circuit into a single body, the hybrid apparatus in combination of the light emitting element and the drive element is obtained. This structure allows the semiconductor apparatus to be smaller and to have such a drive element.

The semiconductor hybrid apparatus thus described is an example in which only the semiconductor thin film groups, in which the pn-junctions are connected in series, are used in a plural number, a semiconductor thin film in which any pn-junction is not connected in series likewise, e.g., a semiconductor thin film having a sole pn-junction may be mounted together. Some sensors such as photo receiving elements, pressure sensing elements, and thermal sensing elements may be mounted together. The drive element 1402 can have any designed structure of drive methods and drive circuits.

This drive element 1402 may be formed of a thin film material or materials such as, e.g., single crystal silicon thin films, polycrystal silicon thin films, and organic thin films. The single crystal silicon thin film can form a drive circuit removing off or polishing a top layer of a region to which the drive element 1402 is formed. The polycrystal silicon thin film can form a drive circuit on the substrate made of, e.g., glass, and can be used with the formed drive circuit as it is or as transferred upon removed. The organic material thin film can directly form a drive circuit by evaporation or coating.

The substrate 1401 can be modified in a various way, and can be made of, as other than the semiconductor substrate such as Si or the like, a ceramic substrate, a glass substrate, and a plastic substrate. The electrode can be made of a transparent electrode material such as, e.g., ITO, ZnO.

Fifth Embodiment

Figure 16:
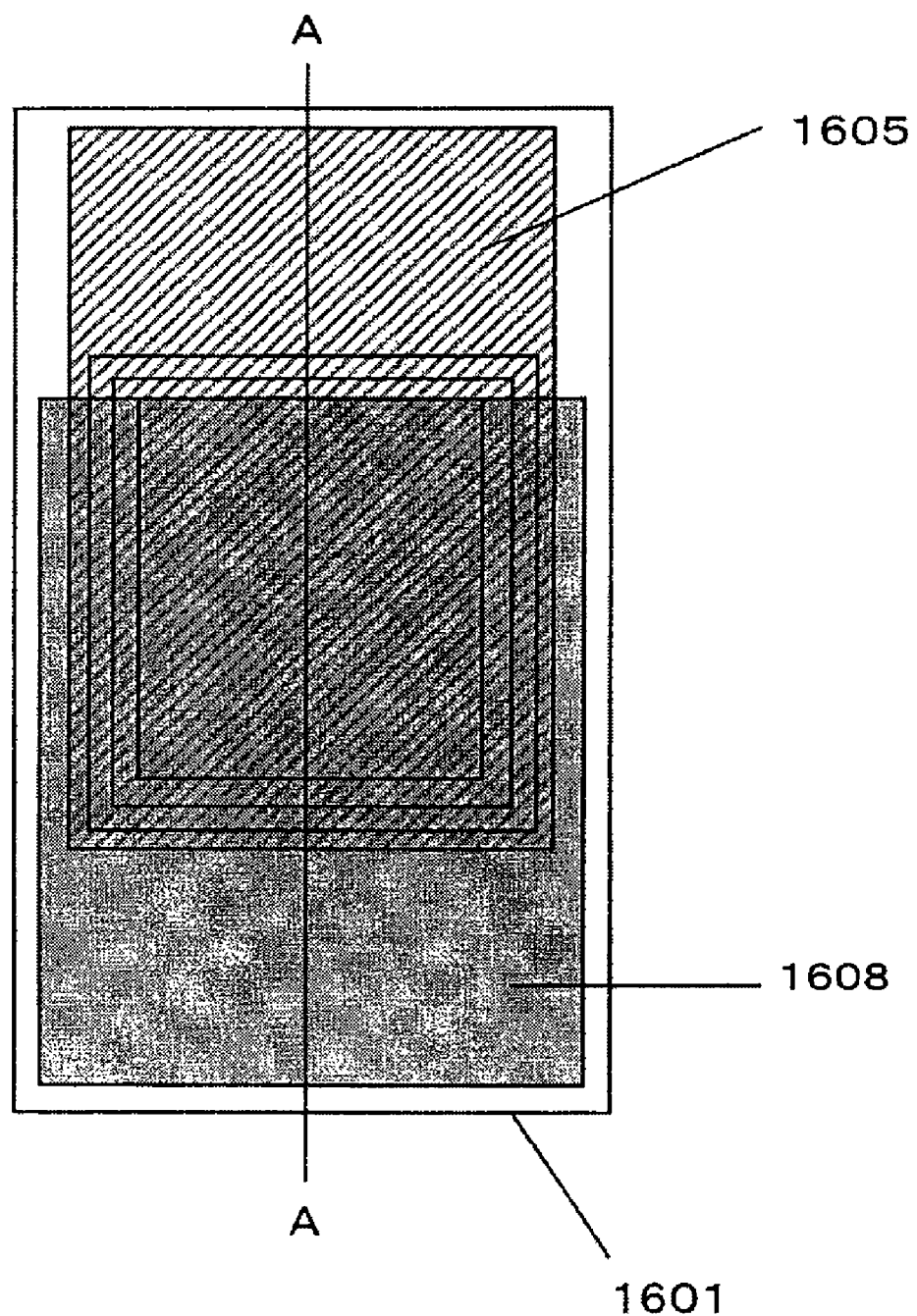
FIG. 16 is a top view showing a semiconductor apparatus according to the fifth embodiment of the invention.
Figure 17:
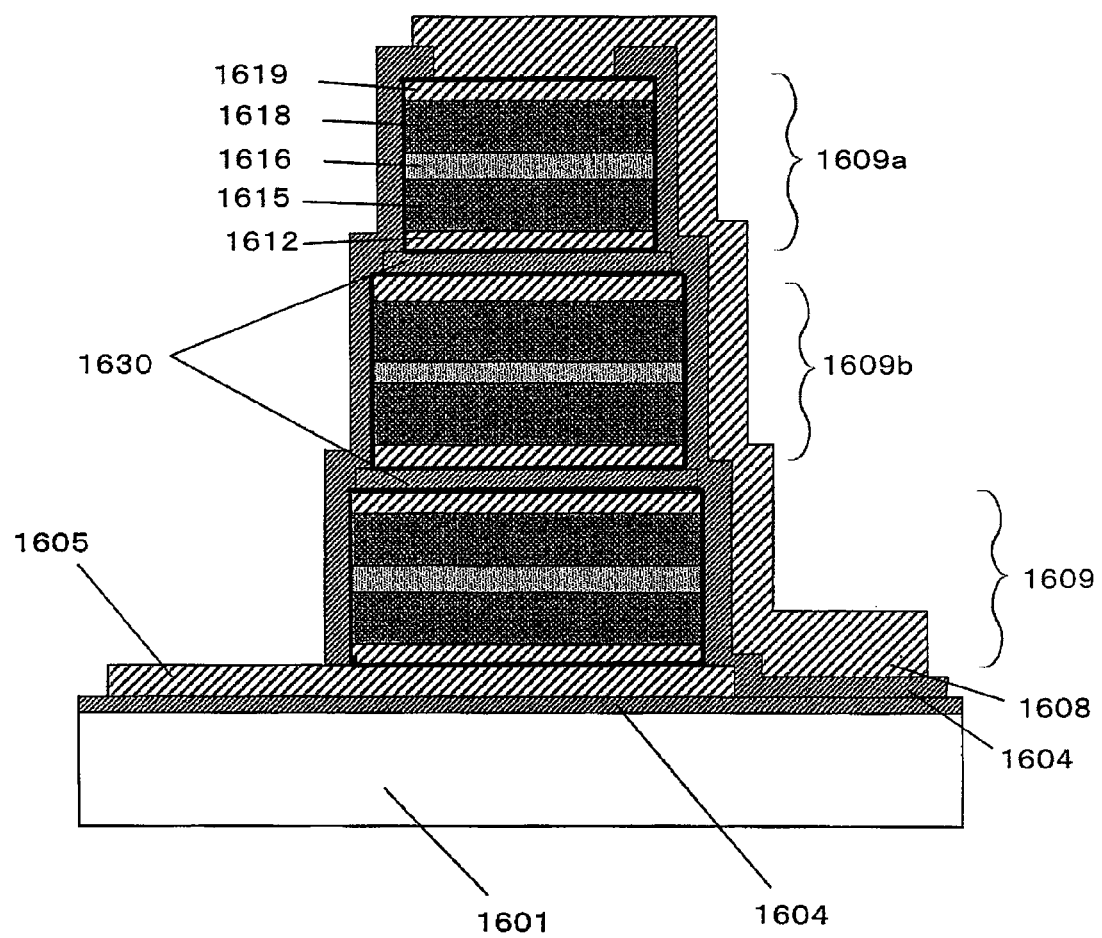
FIG. 17 is a cross section taken along A-A line of the semiconductor apparatus in FIG. 16.

A semiconductor apparatus described in the fifth embodiment is formed, as shown in FIG. 16 and FIG. 17, in which an electrode contacting to the contact layer with respect to the semiconductor thin film described in the fourth embodiment is made of a metal, and in which the entire side faces of the overlapped semiconductor thin films are covered with metal electrodes except one side face.

The semiconductor apparatus describe in the fifth embodiment has an insulator layer 1604 on a substrate 1601. A metal electrode 1605 is formed at an upper side in the overlapping direction of the insulator layer 1604. A semiconductor thin film 1609*c*, a semiconductor thin film 1609*b*, a semiconductor thin film 1609*a* are overlapped via a conducting layer 1630 at an upper side in the overlapping direction of the electrode 1605. A metal electrode 1608 is formed at a further upper side. The metal electrode 1605 and the electrode 1608 can reflect light emitted out of the pn-junctions. The respective layers, electrodes, electrode interconnections are substantially the same as those in the fourth embodiment, and detailed description of those members are omitted for the sake of simplicity.

The semiconductor thin films 1609*a* to 1609*c* have a first conductive type contact layer 1612, a first conductive type clad layer 1615, a first conductive type active layer 1616, a second conductive type clad layer 1618, and a second conductive type contact layer 1619. The pn-junction in the first conductive type active layer 1616 emits light upon flowing current through the semiconductor thin films 1609*a* to 1609*c*.

Thus, the semiconductor thin films 1609*a* to 1609*c* of the formed semiconductor apparatus are substantially the same as those of the semiconductor thin films in the fourth embodiment, and the electrode 1605 serves as the n-type electrode while the electrode 1608 serves as the p-type electrode. Where a voltage is applied upon connecting, e.g., the n-type electrode and the p-type electrode with the minus side and the plus side, respectively, current flows forward at the pn-junctions of the semiconductor thin films 1609*a* to 1609*c* by flowing the current, thereby generating light at each pn-junction.

The semiconductor thin films thus overlapped is covered with the metal electrodes 1605, 1608 except one side surface. Therefore, the light emitted at the pn-junctions of the respective semiconductor thin films are reflected at the electrodes 1605, 1608, and the light can be projected out of the one side surface at which the semiconductor thin film is not covered.

In the semiconductor apparatus described in the fifth embodiment, by connecting in series the pn-junctions upon overlapping films, the light emission is the summation of the light emission intensities of the entire pn-junctions, as different from a semiconductor thin film constituted of a single pn-junction, so that the light emitting intensity can be increased largely. Light having high light emitting intensity can be outputted from the side face direction.

Sixth Embodiment

A semiconductor apparatus described in the sixth embodiment is a semiconductor apparatus in which plural semiconductor apparatus groups in which plural semiconductor thin films having pn-junctions are connected in series and overlapped, are connected in series. The semiconductor apparatus is described in reference to FIGS. 18, 19.

Figure 18:
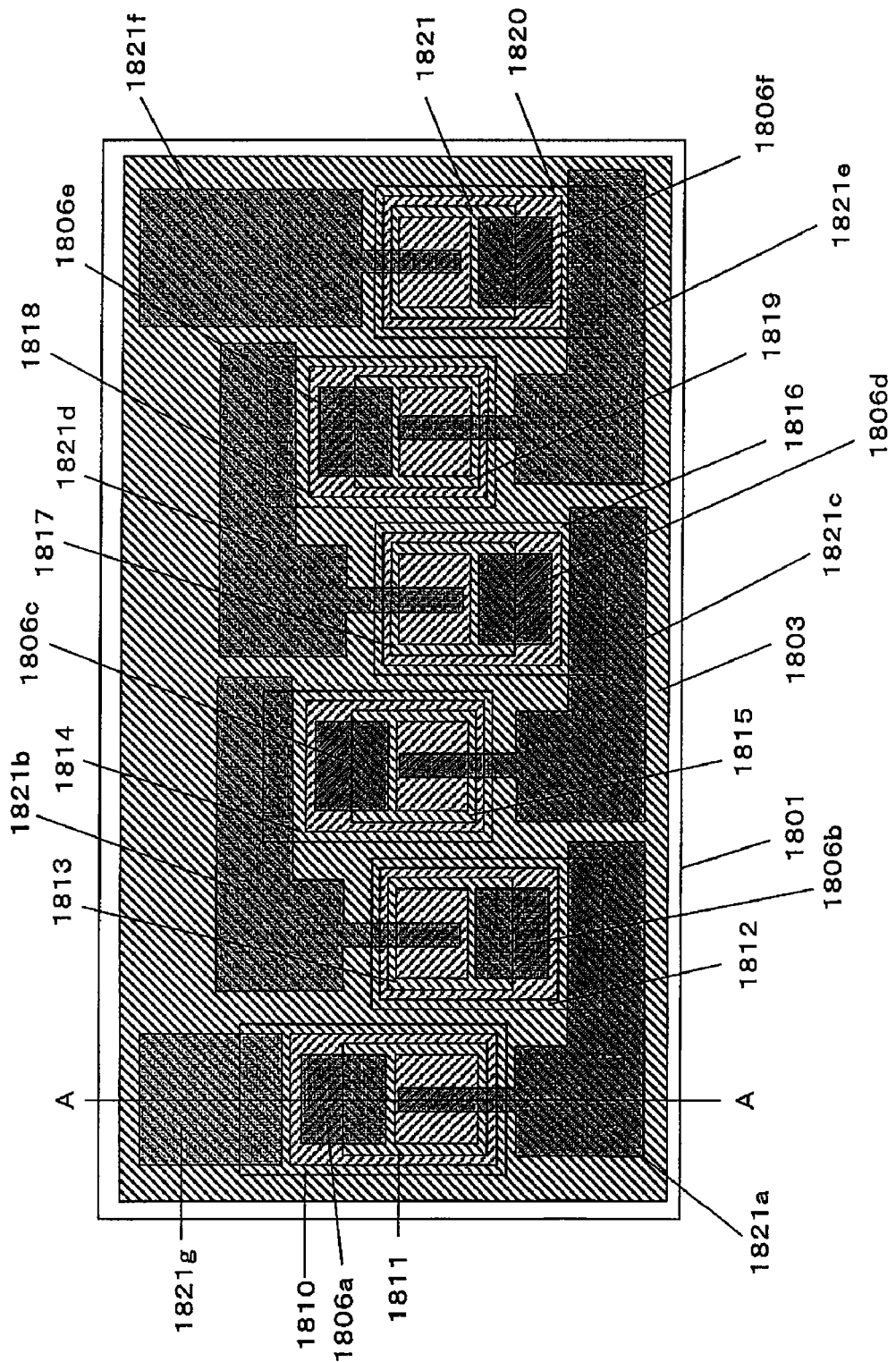
FIG. 18 is a top view showing a semiconductor apparatus according to the sixth embodiment of the invention.
Figure 19:
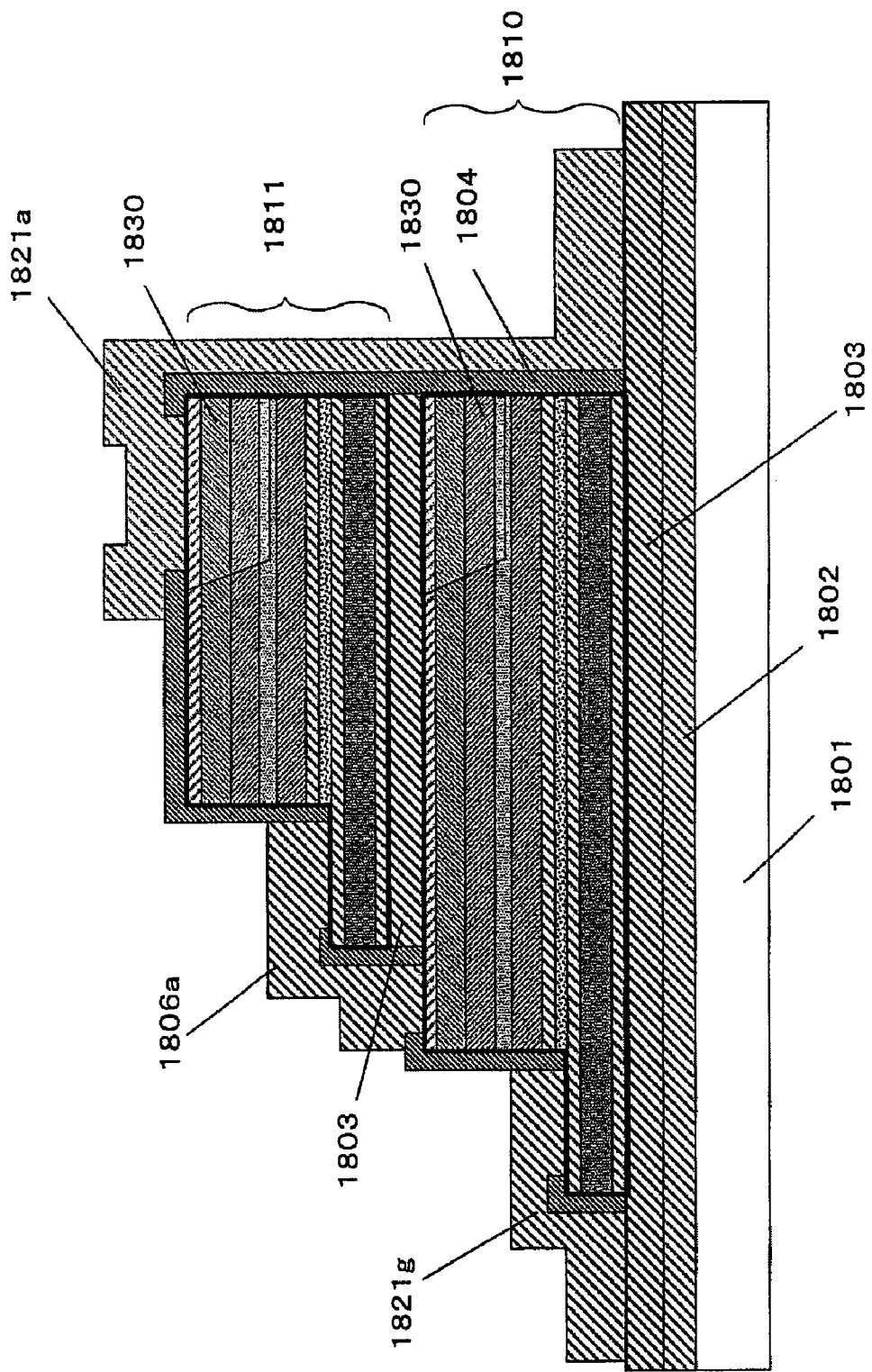
FIG. 19 is a cross section taken along A-A line of the semiconductor apparatus in FIG. 18.

FIG. 18 shows a top view of a semiconductor apparatus according to the sixth embodiment of the invention. FIG. 19 is a cross section taken along A-A line of the semiconductor apparatus in FIG. 18. The semiconductor apparatus illustrated in this embodiment has a reflecting layer 1802 and a passivation film 1803 on a substrate 1801. With this semiconductor apparatus, as on the passivation film 1803, a semiconductor thin film group in which a semiconductor thin film 1811 is overlapped on the semiconductor thin film 1810, a semiconductor thin film group in which a semiconductor thin film 1813 is overlapped on the semiconductor thin film 1812, a semiconductor thin film group in which a semiconductor thin film 1815 is overlapped on the semiconductor thin film 1814, a semiconductor thin film group in which a semiconductor thin film 1817 is overlapped on the semiconductor thin film 1816, a semiconductor thin film group in which a semiconductor thin film 1819 is overlapped on the semiconductor thin film 1818, and a semiconductor thin film group in which a semiconductor thin film 1821 is overlapped on the semiconductor thin film 1820 are arranged at prescribed positions.

One semiconductor thin film group is described with the semiconductor thin film group in which the semiconductor thin film 1811 is overlapped on the semiconductor thin film 1810 shown in FIG. 19. The semiconductor thin film 1810 and the semiconductor thin film 1811 are overlapped via and on the passivation film 1803 formed on the substrate 1801.

The semiconductor thin film 1810 and the semiconductor thin film 1811 are formed, in substantially the same manner as those in the second embodiment, by overlapping a first conductive type bonding layer, a first conductive type conducting layer, a first conductive type contact layer, a first conductive type etching stopper layer, a first conductive type separation layer, a first conductive type lower clad layer, a first conductive type active layer, a first conductive type upper clad layer, a second conductive type conducting layer, and a second conductive type contact layer. In the semiconductor thin film, a high concentration diffused region 1930 reaching an inner portion of the first conductive type active layer by doping impurities to parts of the first conductive type active layer, the first conductive type upper clad layer, the second conductive type conducting layer, and the second conductive type contact layer by mean of selective impurity diffusion or the like. The details of the respective layers are substantially the same as those in the second embodiment and detailed description of those members are omitted for the sake of simplicity.

In the semiconductor thin film group, the second conductive type contact layer of the semiconductor thin film 1810 and the first conductive type contact layer of the semiconductor thin film 1811 are connected with an electrode interconnection 1806*a*. The first conductive type contact layer of the semiconductor thin film 1810 is connected to an electrode 1821*g*, and the second conductive type contact layer of the semiconductor thin film 1821 is connected to an electrode 1821*a*. Each of the semiconductor thin film groups is having substantially the same structure on the substrate 1801.

Those semiconductor thin film groups are arranged in series on the substrate 1801. For example, the second conductive type contact layer of the semiconductor thin film 1811 of the semiconductor thin film group at which the semiconductor thin film 1811 is overlapped on the semiconductor thin film 1810 is connected via an electrode 1821*a* to the first conductive type contact layer of the semiconductor thin film 1812 of the semiconductor thin film group at which the semiconductor thin film 1813 is overlapped on the semiconductor thin film 1812. The respective semiconductor thin film groups are connected in series. An electrode 1821*g* is connected to the first conductive type contact layer of the semiconductor thin film 1810, and an electrode 1821*f* is connected to the second conductive type contact layer of the semiconductor thin film 1821. These electrodes 1821*g*, 1821*f* are connected to electrode pads or the like, thereby flowing current to the respective semiconductor thin film groups and the respective semiconductor thin films forming the groups. Thus, the semiconductor apparatus described in the sixth embodiment has the structure that the respective semiconductor thin film groups are connected in series.

The semiconductor apparatus having the structure described above has the electrode 1821*g* serving as the n-type electrode and the electrode 1821*f* serving as the p-type electrode, and current flows forward at the pn-junctions of the semiconductor thin films 109*a* to 109*c* by flowing the current upon connecting, for example, the n-type electrode with the minus side and the p-type electrode with the plus side, thereby generating light at each pn-junction in substantially the same way as those in the second embodiment.

Accordingly, where the plural semiconductor thin film groups in which plural semiconductor thin films having pn-junctions are connected in series are connected in series, high light emitting intensity is obtained with less amount of the current. The pn-junctions formed at the semiconductor thin films can be easily connected in series.

The substrate, the electrodes, and the semiconductor thin films used in the semiconductor apparatus can be modified in an appropriate manner to the apparatus according to the first to fifth embodiments, and substantially the same advantages can be obtained. The plural semiconductor thin films on the substrate 1801 are not limited to the apparatus in which the entire groups are connected in series, but the apparatus can has a part in which the groups are connected in parallel. A single semiconductor thin film may have plural pn-junctions, and such a semiconductor thin film may be connected in series.

Seventh Embodiment

The semiconductor apparatus described in this seventh embodiment is a semiconductor apparatus in which plural semiconductor thin films are overlapped via a flattening layer for flattening electrode interconnections and layers having such electrode interconnections. The semiconductor apparatus is described hereinafter in reference to FIG. 20 to 23.

Figure 20:
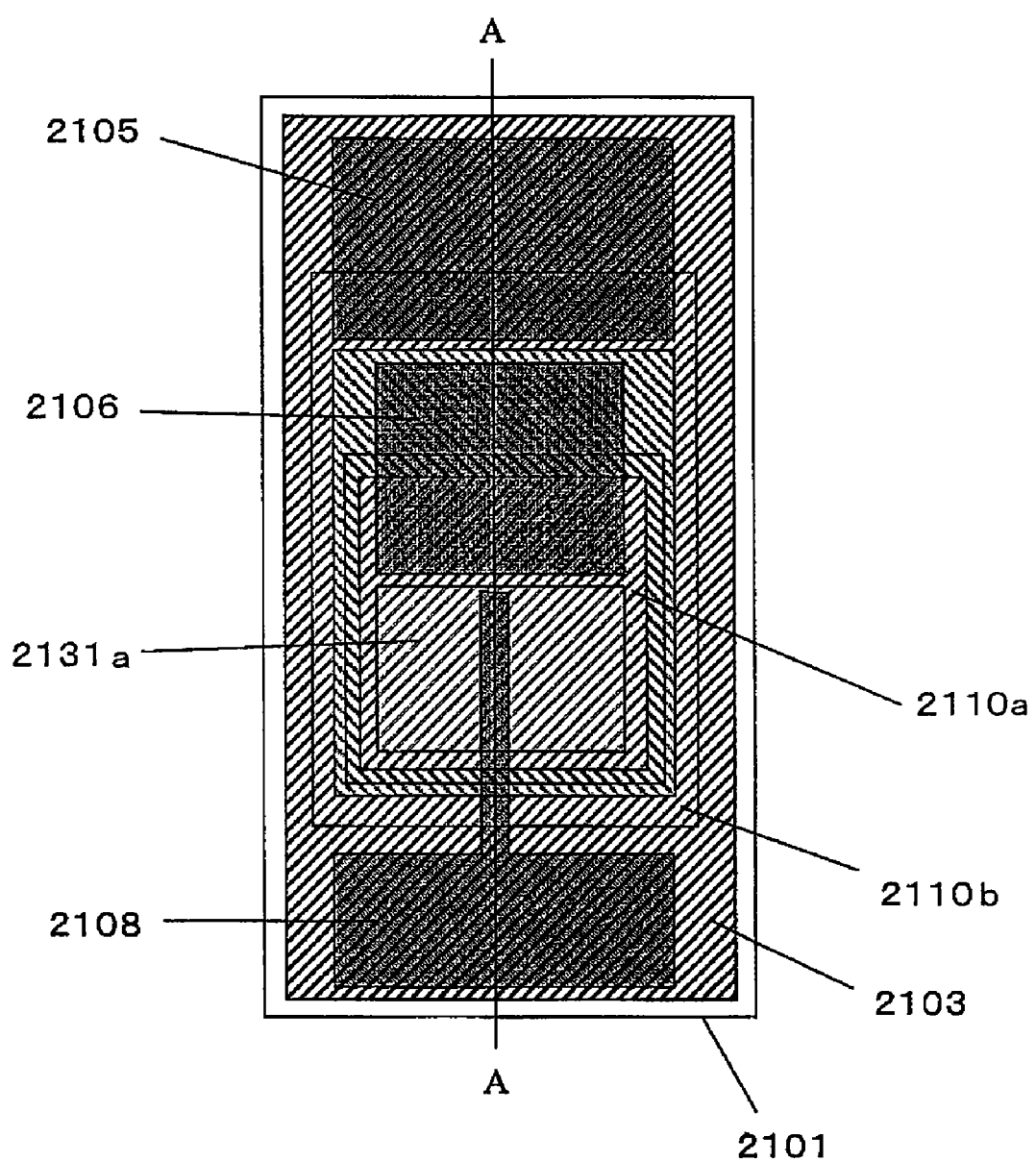
FIG. 20 is a top view showing a semiconductor apparatus according to the seventh embodiment of the invention.
Figure 21:
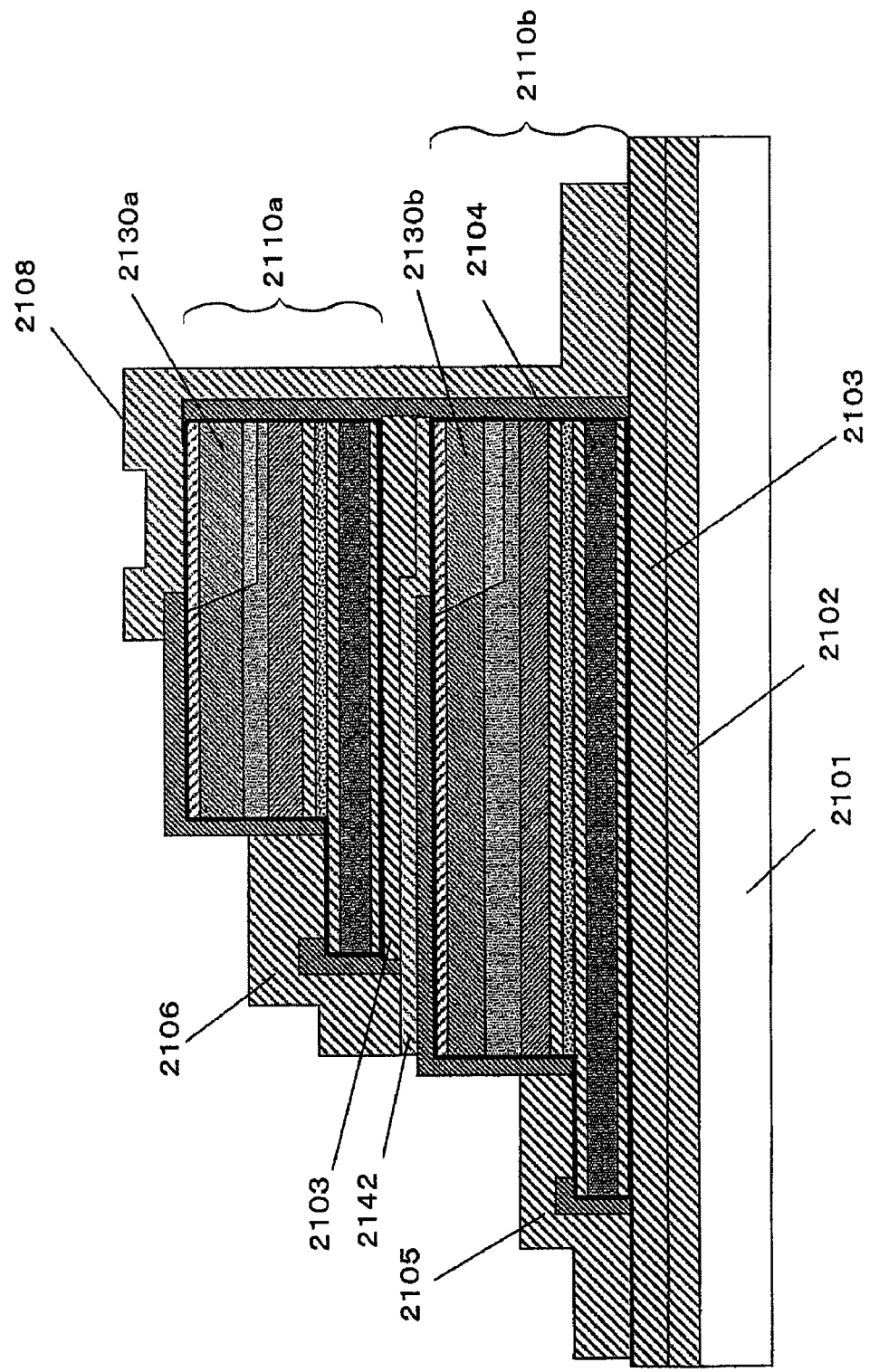
FIG. 21 is a cross section taken along A-A line of the semiconductor apparatus in FIG. 20.

FIG. 20 is a top view showing the semiconductor apparatus described in this seventh embodiment; FIG. 21 is a cross section showing the semiconductor apparatus taken along A-A line shown in FIG. 20. The semiconductor apparatus described in the seventh embodiment includes a reflection layer 2102 and a passivation film 2103 on a substrate 2101. A semiconductor thin film 2110*b*, and a semiconductor thin film 2110*a* are overlapped in this order at an upper side in the overlapping direction of the passivation film 2103.

Figure 22:
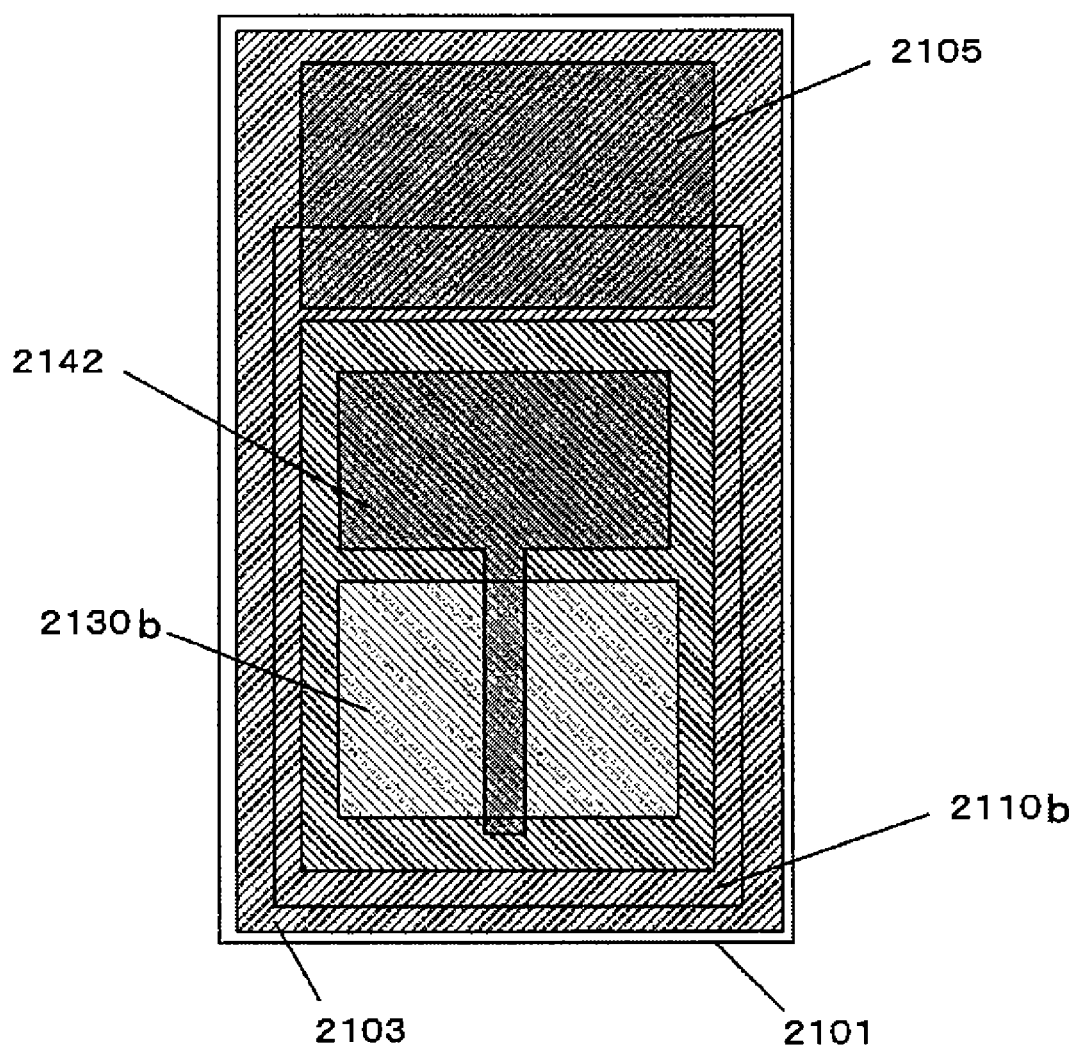
FIG. 22 is a view showing the semiconductor apparatus in a state that the semiconductor thin films of the apparatus at an upper side thereof are removed off.

FIG. 22 is a view showing a situation that the semiconductor thin film 2110*b* only is overlapped on the substrate 2101. As shown in FIG. 22, formed is a pattern interconnection 2142 in which a pattern is formed so as to cover a part of an impurity diffused region 2130*b* formed by impurity diffusion or the like. The pattern interconnection 2142 can be formed as to cover a front surface of the impurity diffused region 2130*b*, and in such a situation, the thickness is desirably set to 300 nm or below.

As shown in FIG. 21, the semiconductor thin film 2110*a* is overlapped on a top surface of the pattern interconnection 2142 via the passivation film 2103. The pattern interconnection 2142 of the semiconductor thin film 2110*b* has an undulation, because corresponding to the top surface shape of the semiconductor thin film 2110*b* and being formed to cover a part of the impurity diffused region 2130*b*. The passivation film 2103 formed between the semiconductor thin film 2110*a* and the semiconductor thin film 2110*b* can made the undulation flat. That is, the passivation film 2103 serves as a flattening film.

Figure 23:
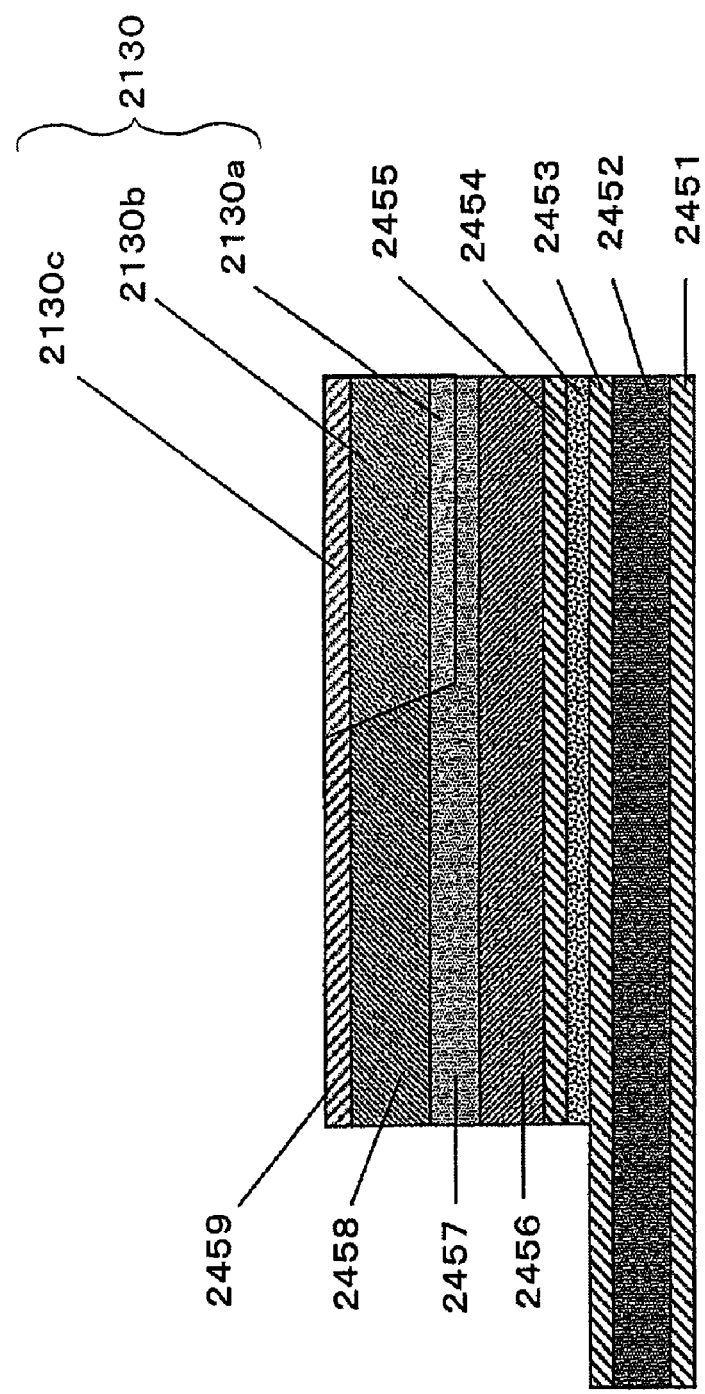
FIG. 23 is a view showing a semiconductor thin film portion of the semiconductor apparatus shown in FIG. 21.

The semiconductor thin film 2110 as shown in FIG. 23 includes the first conductive type bonding layer 2451 made of, e.g., an n-type GaAs layer, the first conductive type conducting layer 2452 made of, e.g., an n-type $Al_sGa_{1-s}As$, the first conductive type contact layer 2453 made of, e.g., an n-type GaAs layer, the first conductive type etching stopper layer 2454 made of, e.g., an n-type InGaP layer, the first conductive type separation layer 2455 made of, e.g., an n-type GaAs layer, the first conductive type lower clad layer 2456 made of, e.g., an n-type $Al_xGa_{1-x}As$ layer, the first conductive type active layer 2457 made of, e.g., an n-type $Al_yGa_{1-y}As$ layer, the first conductive type upper clad layer 2458 made of, e.g., an n-type $Al_zGa_{1-z}As$ layer, and the first conductive type contact layer 2459 made of, e.g., an n-type GaAs layer. The semiconductor thin film 2110 has respective layers substantially the same structure as those of the semiconductor thin film in the first embodiment, and therefore, detailed description of those members are omitted for the sake of simplicity.

A high concentration diffused region 2130 reaching an inner portion of the first conductive type active layer is formed by doping impurities by means of selective impurity doping or the like to parts of the first conductive type active layer 2457, the first conductive type upper clad layer 2458, and the first conductive type contact layer 2459, thereby converting the layers of the first conductive type into the layers of the second conductive type. That is, the high concentration diffused region 2130 is constituted of the second conductive type active layer 2130a, a second conductive type clad layer 2130b, a second conductive type contact layer 2130c.

With the semiconductor thin film 2110, a current flows through the pn-junction in the active layer by connecting the first conductive type contact layer 2452 and the second conductive type contact layer 2130c to electrode such as electrode pads, thereby generating light at the pn-junctions.

The second conductive type contact layer 2130c of the semiconductor thin film 211b and the first conductive type contact layer 2452 of the semiconductor thin film 2110a are connected with the pattern interconnection 2110b and the interconnection electrode 2106 as shown in FIG. 21. The first conductive type contact layer 2452 of the semiconductor thin film 2110b is connected to an electrode 2105, and the second conductive type contact layer 2130c of the semiconductor thin film 2110b is connected to an electrode 2108.

The semiconductor apparatus described in this seventh embodiment thus structured, in substantially the same way as in the first embodiment, has the electrode 2105 serving as the n-type electrode and the electrode 2108 serving as the p-type electrode, thereby injecting a current by connecting, for example, the n-type electrode with the minus side and the p-type electrode with the plus side. The injected current is made to flow forward through the pn-junctions of the semiconductor thin film 2110a, thereby generating light at the pn-junctions. The current flowing through the semiconductor thin film 2110a is injected into the semiconductor thin film 2110b via the electrode interconnection 2106 and the pattern interconnection 2142. The injected current flows forward at the pn-junction of the semiconductor thin film 2110a, thereby emitting light at the pn-junction. Thus, the semiconductor apparatus can increase the light emitting intensity by connecting the pn-junctions in series in substantially the same way as in the first embodiment.

Eighth Embodiment

The semiconductor apparatus described in this eighth embodiment has a structure in which plural semiconductor thin films are not overlapped but connected in series on a single substrate. Hereinafter, this semiconductor apparatus is described in reference to FIGS. 24, 25.

Figure 24:
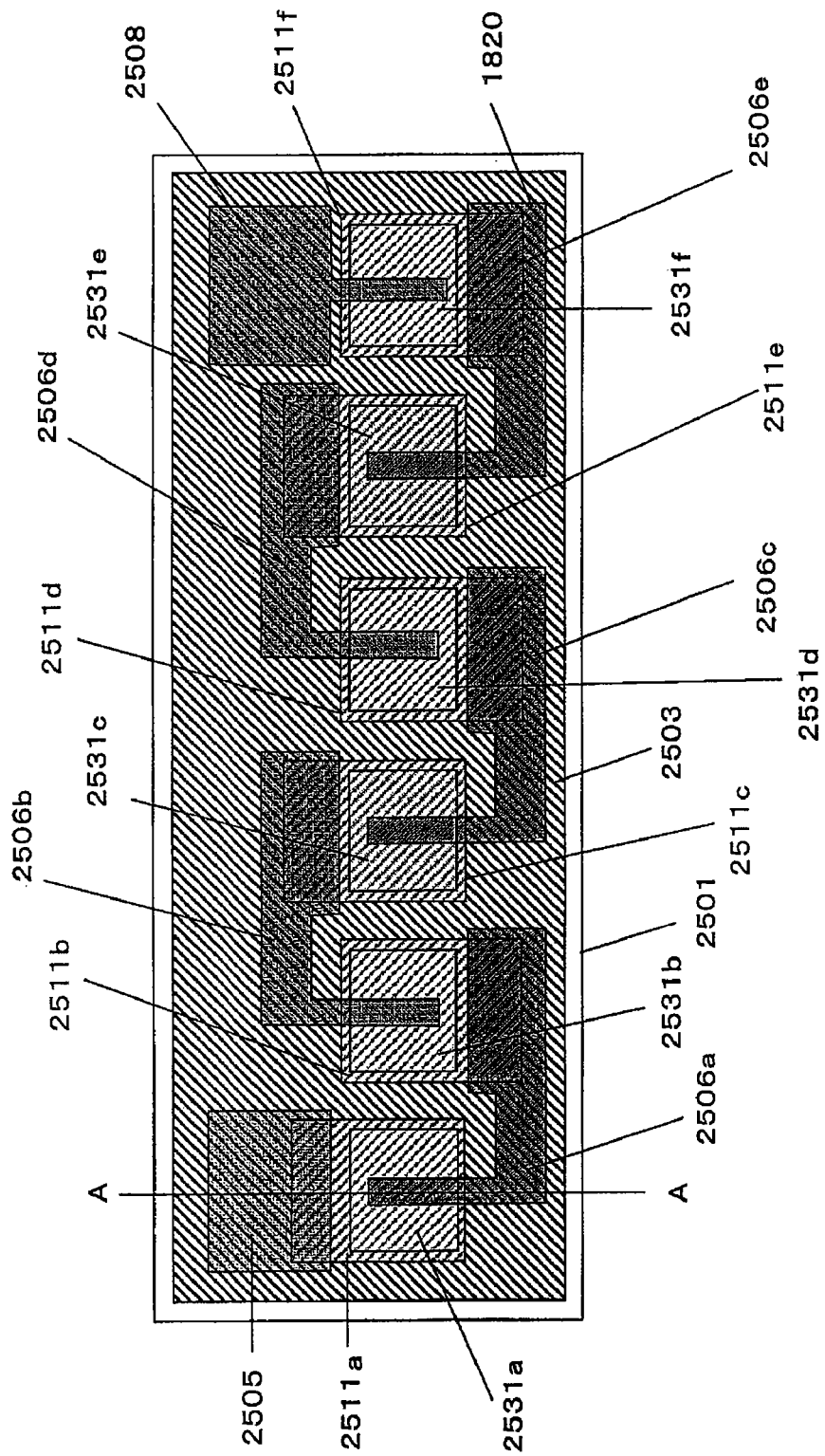
FIG. 24 is a top view showing a semiconductor apparatus according to the eighth embodiment of the invention.
Figure 25:
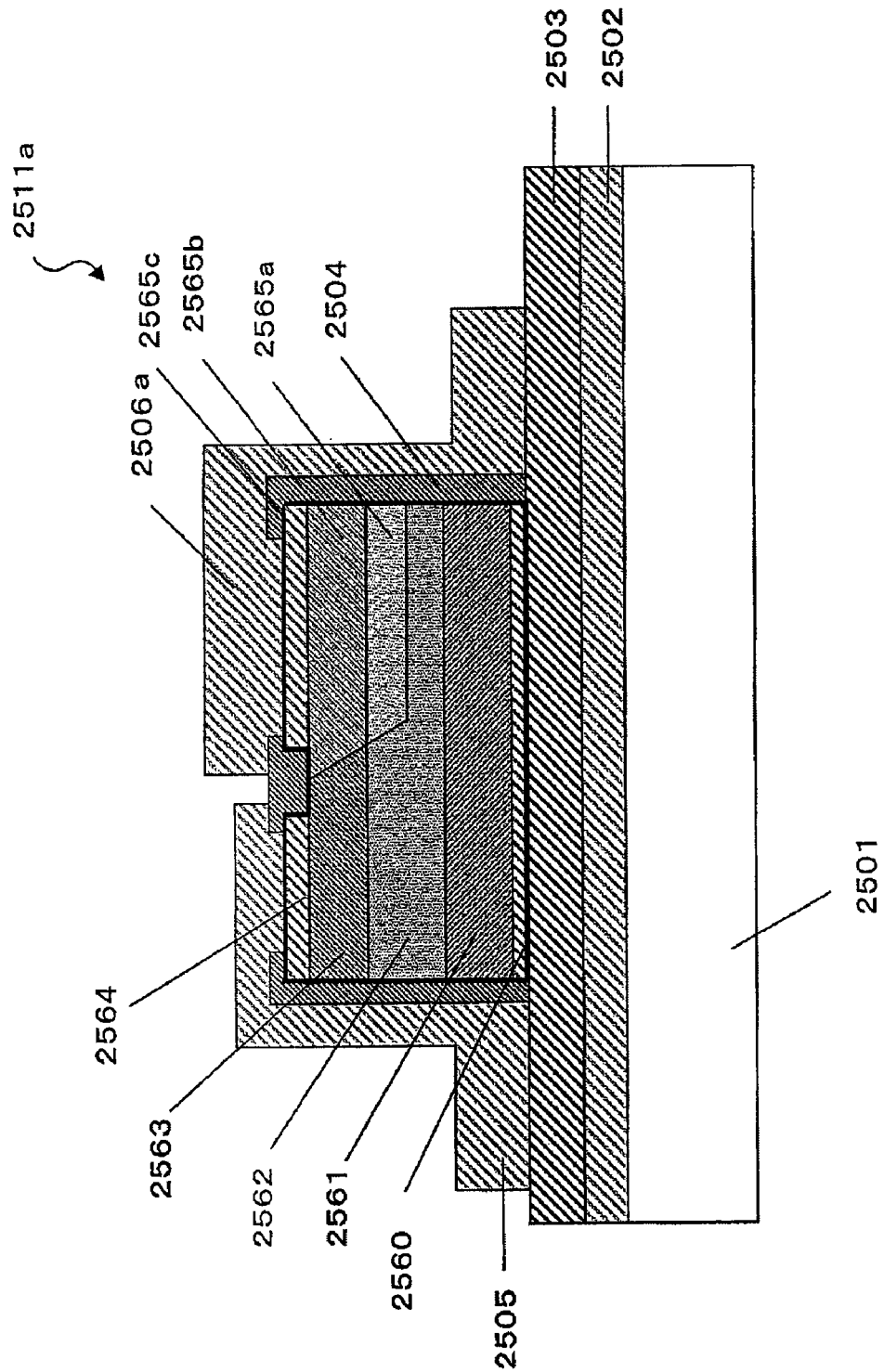
FIG. 25 is a cross section taken along A-A line of the semiconductor apparatus in FIG. 24.

FIG. 24 is a top view showing the semiconductor apparatus of the invention describe in the eighth embodiment. FIG. 25 is a cross section taken along A-A line in FIG. 24. The semiconductor apparatus described in the eight embodiment includes a reflection layer 2501 and a passivation film 2503 on a substrate 2501. A semiconductor thin film 2511a is arranged on the passivation film, and the semiconductor thin films are connected in series with an electrode interconnection 2506. The apparatus also has an electrode 2505 and an electrode 2508 for electrode pads.

The semiconductor thin film 2511a is formed by overlapping a first conductive type bonding layer 2560, a first conductive type lower clad layer 2561, a first conductive type active layer 2562, a first conductive type upper clad layer 2563, and a first conductive type contact layer 2564. Parts of the first conductive type active layer 2562, the first conductive type clad layer 2563, and the first conductive type contact layer 2564 are doped with impurities diffused by selective impurity doping method to form an impurity diffused region 2531a. With this doping operation of the impurities, the first conductive type is converted into the second conductive type, and the second conductive type active layer 2565a, a second conductive type clad layer 2565b, and a second conductive type contact layer 2565c are formed. The semiconductor thin film 2511a formed with those layers is covered with an insulation layer 2504 at portions except a part of the contact layer and a portion for outputting light emitted at the pn-junctions. The first conductive type contact layer 2564 is connected to the electrode 2505, and the second conductive type contact layer 2565a is connected to an electrode interconnection 2506a. The electrode interconnection 2506 is connected to the first conductive type contact layer 2564 of another semiconductor thin film 2511b located adjacently so as to be connected in series with the semiconductor thin film 2511b. The respective semiconductor thin films other than the semiconductor thin film 2511a have substantially the same structure as those in the semiconductor thin film 2511a.

The semiconductor apparatus in which the plural semiconductor thin films are connected in series on the substrate 2501 has the electrode 2506 serving as the n-type electrode and the electrode 2508 serving as the p-type electrode, thereby injecting a current by connecting, for example, the n-type electrode with the minus side and the p-type electrode with the plus side. The injected current is made to flow forward through the pn-junctions of the semiconductor thin film 2511, thereby generating light at the pn-junctions in the semiconductor thin films in substantially the same way as in the second embodiment.

The current flows from the semiconductor thin film 2511f and through the semiconductor thin film 2511e, the semiconductor thin film 2511d, the semiconductor thin film 2511c, the semiconductor thin film 2511b, and the semiconductor thin film 2511a in this order, thereby generating light at the pn-junctions of the respective semiconductor thin films at substantially the same time. Thus, connecting the pn-junctions in series allows the pn-junctions of the respective semiconductor thin films to emit light upon injection of current. The light emitting intensity emitted out of the single substrate 2501 becomes the summation of the light emitting intensities of the entire pn-junctions, so that the light emitting intensity can be increased largely.

The semiconductor apparatus described in the eighth embodiment can increase light emitting intensity emitted out of the single substrate 2501 with a less amount of supplied current by not overlapping but connecting the respective semiconductor thin films having the pn-junctions in series, so that the light emission efficiency is greatly improved. The semiconductor apparatus has a simpler structure and can be made with simpler manufacturing steps because the semiconductor thin films are not overlapped.

Figure 26:
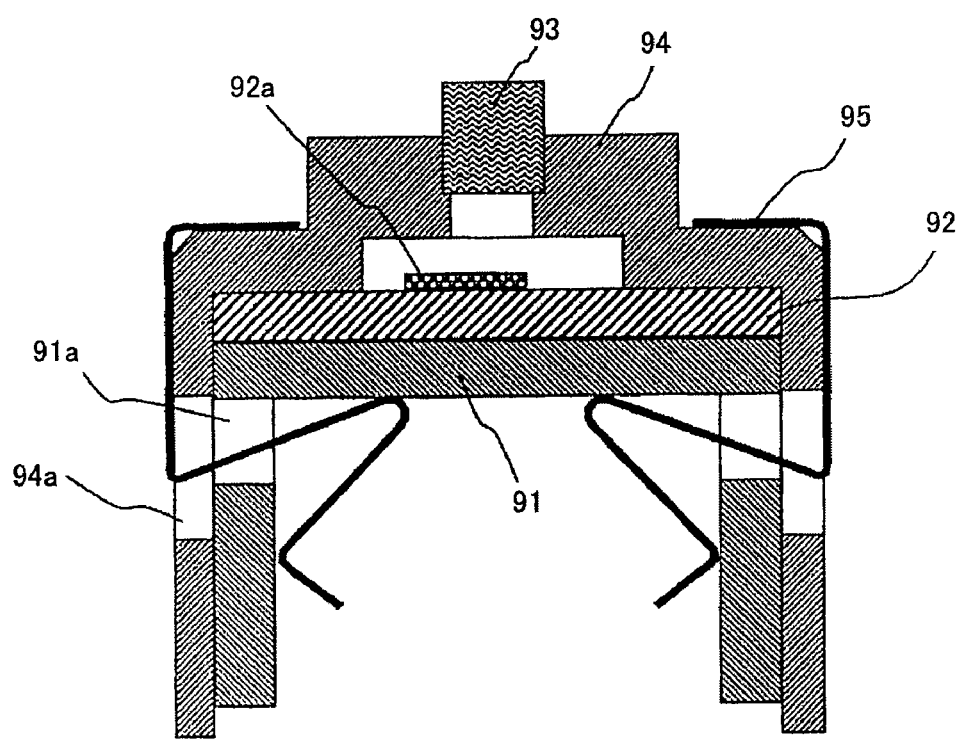
FIG. 26 is a diagram showing a print head according to the invention.

The semiconductor apparatuses described in the first and second embodiments can be a semiconductor hybrid apparatus to which a drive apparatus having a drive circuit is mounted as in the fourth embodiment. Exemplified as such an apparatus is, e.g., an LED print head. The LED print head is used for, e.g., an exposing apparatus for electrophotographic printers, and electrophotographic photocopiers. More specifically, the LED print head is structured by assembling an LED unit 92 having LED elements on a prescribed base material 91 as shown in FIG. 26. The LED unit 92 is constituted in which the semiconductor apparatus illustrated as one of the first to fourth embodiments is mounted on an assembly board. A rod lens array 93 serving as an optical device for condensing light outputted from a light emitting portion of the LED unit 92 is arranged above the light emitting portion at a light emitting portion unit 92*a* formed at the LED unit 92. The rod lens array 93 is formed by arranging plural cylindrical lenses along the light emitting portion arrayed linearly at the light emitting portion unit 92*a*, and is held at a prescribe position by a lens holder 94 serving as an optical device holder. It is to be noted that the light emitting portion at the light emitting portion unit 92*a* is the semiconductor thin film as described above.

The lens holder 94 is formed is formed so as to cover the base material 91 and the LED unit 92. The base material 91, the LED unit 92, and lens holder 94 are clamped in a united manner with a clamper 95 disposed in being inserted into an opening 91*a* formed at the base material and an opening 94*a* formed at the lens holder 94.

With the LED print head thus structured, the light generated at the LED unit 92 is condensed by the rod lens array 93 and radiated to prescribed exterior members. As described above, with the LED print head thus structured, images can be formed efficiently with high quality because the semiconductor apparatus described in one of the first to eighth embodiments is used as the LED unit 92.

The LED print head is, for example, used for image forming apparatuses. The image forming apparatus is an apparatus for forming images upon fixing toners on a prescribed recording medium, and is applicable to printers, facsimile machines, photocopiers, and complex machines utilizing a transfer type electrophotographic process.

Figure 27:
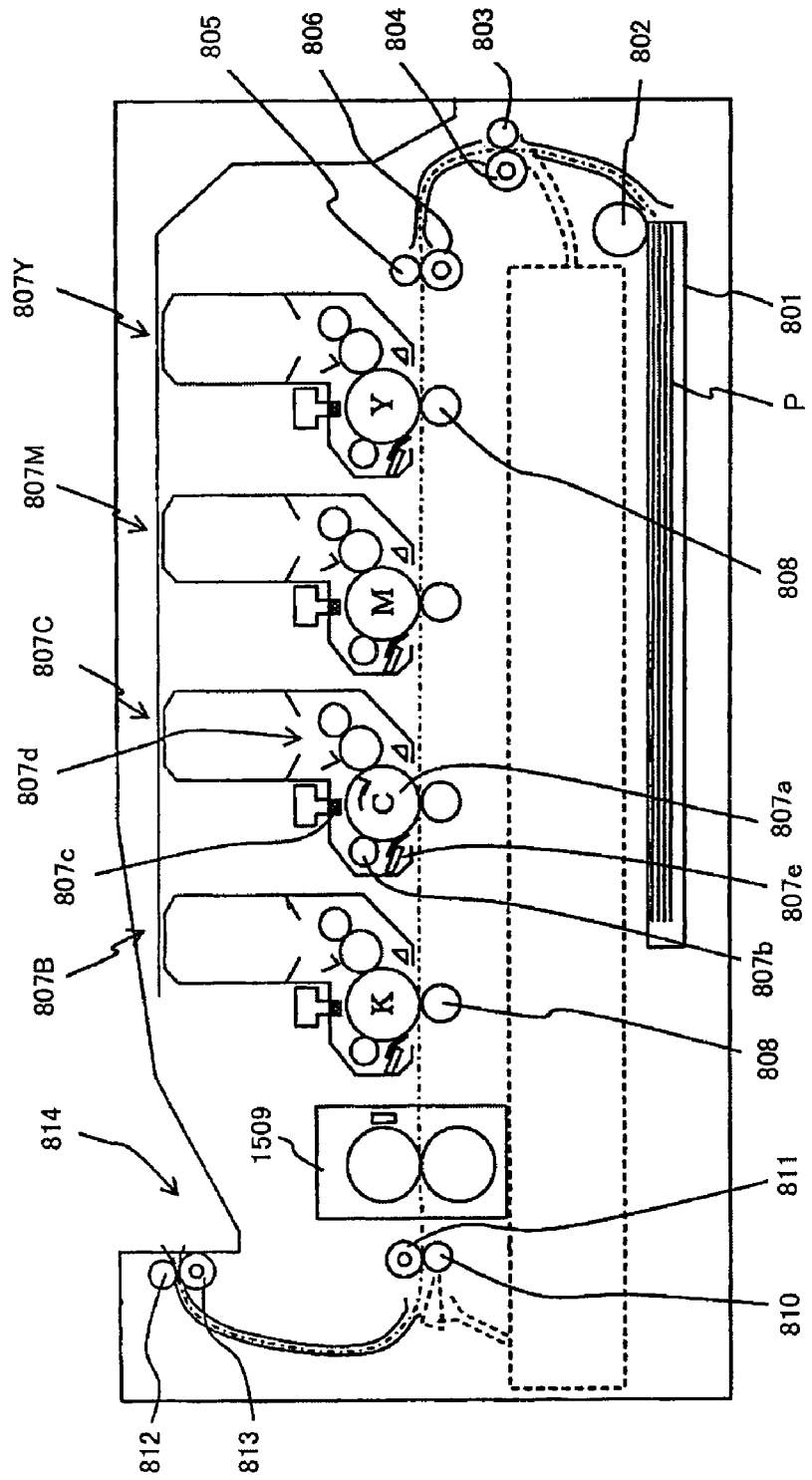
FIG. 27 is a diagram showing an image forming apparatus according to the invention.

An image forming apparatus, as shown in FIG. 27, includes a paper cassette 801 for containing recording media P on which no image is recorded in an accumulated manner. A recording medium P contained in the paper cassette 801 is fed sheet by sheet from the paper cassette 801 according to rotation of a hopping roller 802 disposed so as to contact the surface of the recording media, and is conveyed to process units 807Y, 807M, 807C, 807B described below in accordance with rotations of a pinching roller 803, a register roller 804, a pinching roller 805, and a register roller 806, which are disposed in a downstream side of the hopping roller 802 in the medium conveyance route. The image forming apparatus at that time conveys the recording medium P to the process units 807Y, 807M, 807C, 807B in adjusting obliquely feeding of the recording medium P by holding in a sandwiching manner the medium with the pinching roller 803, the register roller 804, the pinching roller 805, and the register roller 806.

With the image forming apparatus, the four process units 807Y, 807M, 807C, 807B for producing images in four colors, yellow (Y), magenta (M), cyan (C), and black (B) are arranged sequentially from an upstream side along the medium conveyance route at a position on a downstream side of the pinching roller 805 and the register roller 806 in the medium conveyance route. It is to be noted that those process units 807Y, 807M, 807C, 807B are collectedly referred to as a process unit 807 because having a common structure.

The process unit 807 has a photosensitive drum 807*a* as an image carrier driven to rotate in the medium conveyance direction with a drive source and gears, not shown. A charging apparatus 807*b* for the surface of the photosensitive drum 807*a*, and an exposing apparatus 807*c* for radiating selectively light to the surface of the photosensitive drum 807*a* charged by the charging apparatus 807*b* are disposed at the periphery of the photosensitive drum 807*a* in the order from the upstream side in the rotation direction. The LED print head described above is used for the exposing apparatus 807*c*. The process unit 807 further includes a developing apparatus 807*d* for forming toner images upon supplying toners on the surface of the photosensitive drum 807*a* on which electrostatic latent images are formed, and a cleaning apparatus 807*e* for removing off the toner remaining on the surface of the photosensitive drum 807*a*.

In the image forming apparatus, a transfer roller 808 made of a semi-conducting rubber or the like is disposed at a position facing to the respective photosensitive drums 807*a* of the process units 807. The image forming apparatus generates a potential difference between the surface of the photosensitive drum 807*a* and the surfaces of the respective transfer rollers 808 to cling to the recording medium P the toner on the photosensitive drum 807*a*.

The image forming apparatus further, on a downstream side of the process units 807Y, 807M, 807C, 807B, includes a heating roller driven to rotate in the medium conveyance direction, and a fixing apparatus 809 mounted with a backup roller drive to rotate in substantially contacting with the heating roller. The fixing apparatus 809 fixes toner transferred onto the recording medium P by sandwiching the recording medium P with the heating roller and the backup roller to apply pressure and heat.

The image forming apparatus thus formed conveys the recording medium P to the process unit 807 at a prescribed medium conveyance rate, and in accordance with this operation, forms images on the recording medium P with these process units 807. More specifically, in the image forming apparatus, the LED elements, not shown, formed at the exposing apparatus 807*c* are emitted where an image signal to be recorded is inputted to the process unit 807 under a state that the recording medium P is conveyed, and the photosensitive drum 807*a* charged by the charging apparatus 807*b* is exposed to form electrostatic latent images on the surface of the photosensitive drum 807*a*. The image forming apparatus charges toner contained in the process unit 807, attaches the toner to the electrostatic latent images, and transfers the toner images to the recording medium P with the transfer roller 808.

The image forming apparatus renders the recording medium feed through the process units 807Y, 807M, 807C, 807B sequentially, and overlaps the toner images in respective colors to the recording medium P sequentially by those operations during this feeding procedure.

The image forming apparatus further forms images upon fixing the toner images on the recording medium P with the fixing apparatus 809 where the recording medium P transferred with toner not fixed is conveyed to the fixing apparatus 809. The image forming apparatus conveys the recording medium P in accordance with rotations of a pinching roller 810, a delivery roller 811, a pinching roller 812, and a delivery roller 813, which are arranged on a downstream side of the fixing apparatus 809 in the medium conveyance route, and delivers the medium to a recording medium stacker tray 814.

The image forming apparatus can form multicolor images on the recording media with operations thus described. As described above, the image forming apparatus can form images with high quality and good efficiency in terms of interior space of the apparatus, because the LED print head described above is used as the exposing apparatus 807*c*.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention should not be limited by the specification, but be defined by the claims set forth below.

What is claimed is:

1. A semiconductor apparatus comprising:
   a substrate;
   a plurality of semiconductor thin films, vertically, stacked on each other, formed on said substrate, each of said semiconductor thin films having a pn-junction so that all of said pn-junctions are connected serially, said plurality of the semiconductor thin films including a thin film that is the farthest from said substrate,
      wherein each said semiconductor thin film is formed on a passivation film positioned between the substrate and the semiconductor thin film, and a bottom surface of each said semiconductor thin film located on an upper side of the passivation film is isolated from a top surface of an adjacent said semiconductor thin film located directly below the passivation film by the passivation film,
   a plurality of first electrodes, each said first electrode connected to an inside of one of the plurality of semiconductor thin films;
   an insulating layer disposed on a side of each of the plurality of semiconductor thin films; and
   a second electrode disposed on the top surface, which is away from the substrate, of the thin film that is farthest from the substrate and disposed on the side of each of the plurality of semiconductor thin films, the insulating layer separating the second electrode from the side of each of the plurality of semiconductor films, the second electrode feeding carriers into the inside of the thin film that is farthest from the substrate and serially through the remaining plurality of semiconductor thin films.

2. The semiconductor apparatus according to claim 1, wherein a current is fed between each of the first electrodes and the second electrode to said semiconductor thin films overlapped on said substrate to emit, from an upper side of said semiconductor thin film in an overlapping direction, light produced at said pn-junctions by carrier injection.

3. The semiconductor apparatus according to claim 1, wherein each said semiconductor thin film has a limited region for emitting light.

4. The semiconductor apparatus according to claim 1, wherein said plurality of the semiconductor thin films are formed in an overlapping manner on said substrate via a conducting film allowing a current flowing through said plurality of the semiconductor thin films.

5. The semiconductor apparatus according to claim 4, wherein said conducting film includes a metal portion.

6. The semiconductor apparatus according to claim 4, wherein said conducting film includes a transparent conductor film.

7. The semiconductor apparatus according to claim 1, wherein said substrate includes a drive circuit thereon.

8. The semiconductor apparatus according to claim 1, wherein said semiconductor thin films are covered at top and side surfaces with a metal layer, and wherein a current is fed between each of the first electrodes and the second electrode to said semiconductor thin films overlapped on said substrate to output light, emitted upon carrier injection through said pn-junctions, from an end surface of said semiconductor thin films in an overlapping direction.

9. The semiconductor apparatus according to claim 1, wherein said plural semiconductor thin films are overlapped on said single substrate via a flattening film for flattening an electrode interconnection and a layer having said electrode interconnection.

10. A print head comprising a base material: and
    an LED unit having the semiconductor apparatus as set forth in claim 1.

11. An image forming apparatus comprising:
    an image forming section for forming images:
    an exposing means having said print head as set forth in claim 10.

12. The semiconductor apparatus according to claim 1, wherein each of said plurality of semiconductor thin films includes a light emitting element and said passivation film has transparency with respect to light emitted from said light emitting element.

13. The semiconductor apparatus according to claim 12, wherein each of said plurality of semiconductor thin films has electrodes of p-type and n-type on a side of said substrate.

* * * * *